United States Patent
Ueda et al.

(10) Patent No.: US 8,026,776 B2
(45) Date of Patent: Sep. 27, 2011

(54) ACOUSTIC WAVE DEVICE, DUPLEXER, COMMUNICATION MODULE, AND COMMUNICATION APPARATUS

(75) Inventors: Masanori Ueda, Kawasaki (JP); Motoaki Hara, Kawasaki (JP); Shogo Inoue, Kawasaki (JP); Kenya Hashimoto, Chiba (JP); Yasutomo Tanaka, Chiba (JP); Masatsune Yamaguchi, Chiba (JP); Tatsuya Omori, Chiba (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 340 days.

(21) Appl. No.: 12/363,260

(22) Filed: Jan. 30, 2009

(65) Prior Publication Data

US 2009/0201104 A1  Aug. 13, 2009

(30) Foreign Application Priority Data

Jan. 31, 2008  (JP) .................................. 2008-021531
Oct. 30, 2008  (JP) .................................. 2008-280209

(51) Int. Cl.
*H03H 9/54* (2006.01)
*H03H 9/64* (2006.01)
*H03H 9/70* (2006.01)
*H03H 9/72* (2006.01)

(52) U.S. Cl. ......... 333/133; 333/189; 333/193; 333/195

(58) Field of Classification Search .................. 333/189, 333/193–196, 133; 310/313 B, 313 D
See application file for complete search history.

(56) References Cited

U.S. PATENT DOCUMENTS

| | | | | |
|---|---|---|---|---|
| 5,726,610 A | * | 3/1998 | Allen et al. | 333/133 |
| 6,204,737 B1 | * | 3/2001 | Ella | 333/187 |
| 6,844,795 B2 | * | 1/2005 | Inose | 333/193 |
| 6,879,224 B2 | * | 4/2005 | Frank | 333/189 |
| 6,909,338 B2 | * | 6/2005 | Omote | 333/133 |
| 6,924,715 B2 | * | 8/2005 | Beaudin et al. | 333/133 |
| 7,459,990 B2 | * | 12/2008 | Wunnicke et al. | 333/133 |
| 7,554,422 B2 | * | 6/2009 | Nakatsuka et al. | 333/133 |
| 2007/0030096 A1 | * | 2/2007 | Nishihara et al. | 333/133 |
| 2007/0052494 A1 | | 3/2007 | Shibagaki et al. | |

FOREIGN PATENT DOCUMENTS

| | | | |
|---|---|---|---|
| JP | 6-61783 | * | 3/1994 |
| JP | 7-273597 | * | 10/1995 |
| JP | 8-65089 A | | 3/1996 |
| JP | 2000-77972 | * | 3/2000 |
| JP | 2003-152501 | * | 5/2003 |
| JP | 2004-15397 | * | 1/2004 |

OTHER PUBLICATIONS

English language machine translation of JP 2000-77972, published Mar. 14, 2000.*

* cited by examiner

*Primary Examiner* — Barbara Summons
(74) *Attorney, Agent, or Firm* — Arent Fox, LLP

(57) ABSTRACT

An acoustic wave device includes a ladder-type filter in which resonators are connected in a ladder configuration. In the acoustic wave device, series-connected resonators are connected in a parallel line in the ladder-type filter, and the resonators connected in the parallel line have mutually different resonance frequencies.

11 Claims, 19 Drawing Sheets

ACOUSTIC WAVE DEVICE, DUPLEXER, COMMUNICATION MODULE, AND COMMUNICATION APPARATUS

CROSS-REFERENCE TO RELATED APPLICATIONS

This application is based upon and claims the benefit of priority of the prior Japanese Patent Application No. 2008-021531 filed on Jan. 31, 2008 and the prior Japanese Patent Application No. 2008-280209 filed on Oct. 30, 2008, the entire contents of which are incorporated herein by reference.

FIELD

The embodiment discussed herein is related to an acoustic wave device, a duplexer, a communication module, and a communication apparatus.

BACKGROUND

In recent years, filter elements for high frequency communication that have a characteristic of transmitting only electrical signals in a specified frequency band have been developed by combining a plurality of surface acoustic wave (hereinafter, called SAW) resonators that use a piezoelectric material and resonators that use piezoelectric thin film bulk waves (hereinafter, called an FBAR (Film Bulk Acoustic Resonator)). Due to being smaller in outward form size than other dielectric filters and ceramic filters and having a sharp roll-off characteristic, filter parts that employ SAW and FBAR are suited for mobile communication parts such as mobile phones for which a small size and narrow fractional bandwidth are demanded. In recent years there has been a trend of including a plurality of frequency band systems in a single mobile phone for the purpose of expanding the coverage area etc., and therefore such mobile phones include filters and duplexers appropriate for a plurality of frequencies.

A duplexer is an example of an applied part that includes a ladder-type filter in which a plurality of SAW resonators and FBARs are connected. A duplexer has a transmission/reception function. The duplexer is used in a wireless device in which the transmission signal frequency and reception signal frequency are different. A ladder-type filter in which resonators are connected serial-parallel in a ladder configuration is an example of a filter that includes SAW resonators and FBARs. Ladder-type filters can be changing the number of levels and/or changing the capacitance ratio of the resonators arranged serial-parallel. Ladder-type filters are easy to design since the insertion loss, out-of-band suppression. Another example of a filter including SAW resonators and FBARs is a lattice-type filter in which resonators are connected serial-parallel in a lattice configuration. There has been a proposal to connect a capacitor to a ladder-type filter and improve the skirt characteristic of the filter (see Japanese Patent Laid-Open No. H08-65089). The "skirt characteristic" is the sharpness of a characteristic on the high frequency side and low frequency side of the passband, and the sharper the characteristic, the more favorable the characteristic is.

FIG. 17 is a circuit diagram of a typical ladder-type filter. FIG. 18 and FIG. 19 are circuit diagrams of filters disclosed in Patent Document 1. The filters illustrated as FIG. 18 and FIG. 19 are ladder-type filters in which capacitors have been connected.

Technology for improving the skirt characteristic of a filter is important technology to particularly filters and duplexers whose transmission/reception frequency spacing is adjacent, and this technology greatly influences the performance of a communication terminal.

FIG. 20A is a circuit diagram of a ladder-type filter in which a capacitor has been connected. FIG. 20B is a frequency characteristic of the ladder-type filter illustrated as FIG. 20A. The ladder-type filter illustrated as FIG. 20A includes an FBAR filter that uses AlN. The constants of the resonators included in the ladder-type filter are as follows: capacitance ratio y=16, resonance Q=800, resonance frequency of resonators S1 to S4=1.002 GHz, resonance frequency of resonators P1 to P3=0.968 GHz, capacitance of resonators S1 and S4=6.4 pF, capacitance of resonators S2, S3, and P1 to P3=3.2 pF.

When a capacitor having a capacitance of 10 pF is connected to the ladder-type filter illustrated as FIG. 20A and the frequency characteristic is checked, a change in the skirt characteristic on the high frequency side of the passband can been seen, illustrated as FIG. 20B. Connecting a capacitor having the large capacitance of 20 pF to the ladder-type filter (illustrated as FIG. 20A) enables obtaining an even more effective result.

As the capacitance of the capacitor increases, there is a possibility that the element size of the filter will become large. An increase in the element size of the filter causes an increase in the size of a communication module including the filter and a communication apparatus including the communication module.

A process for newly forming a capacitor in the filter element becomes necessary which leads to a rise in cost.

SUMMARY

According to an aspect of the invention, an acoustic wave device includes a ladder-type filter in which a plurality of resonators are connected, wherein a plurality of resonators are series-connected in a parallel line in the ladder-type filter, and the resonators connected in the parallel line have mutually different resonance frequencies.

According to an aspect of the invention, an acoustic wave device includes a ladder-type filter in which a plurality of resonators are connected, wherein the acoustic wave device further comprises a compensating resonator that is parallel-connected to a series line in the ladder-type filter, and the compensating resonator has a resonance frequency that is in a range of from a resonance frequency of a resonator connected in a parallel line to a resonance frequency of a resonator connected in the series line, inclusive.

A third acoustic wave device disclosed in the present application combines a ladder-type filter and an electrical switch and includes a filter in which band variability is possible.

A duplexer, a communication module, and a communication apparatus disclosed in the present application include the first acoustic wave device or the second acoustic wave device.

The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF EMBODIMENTS

Figure 1:
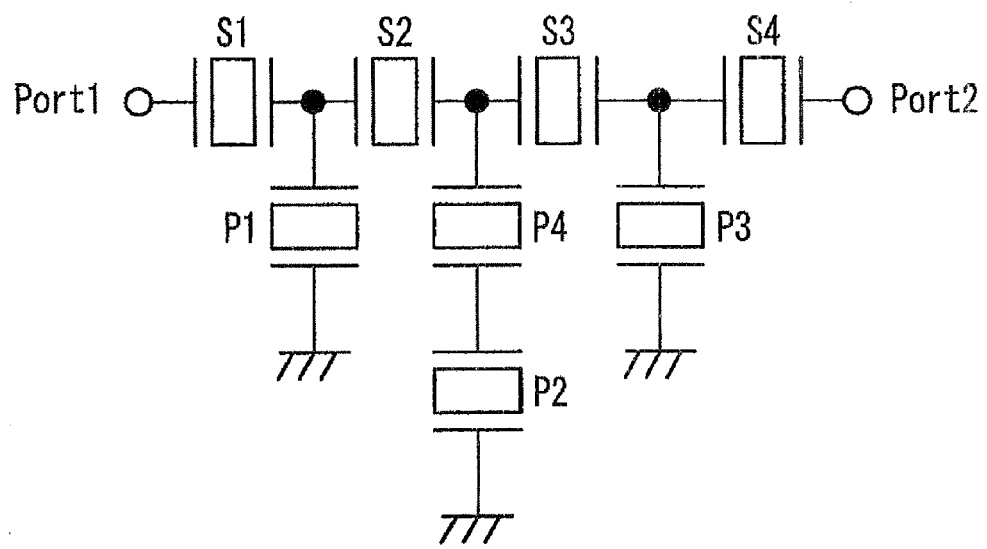
FIG. 1 is a circuit diagram of an acoustic wave device according to an embodiment.

A first acoustic wave device disclosed in the present application is an acoustic wave device including a ladder-type filter in which a plurality of resonators are connected, wherein a plurality of resonators are series-connected in a parallel line in the ladder-type filter, and the resonators connected in the parallel line have mutually different resonance frequencies.

In the acoustic wave device according to the embodiment of the present invention, the resonators series-connected in the parallel line may include a compensating resonator having a resonance frequency that is higher than a resonance frequency of another resonator connected in the parallel line and a resonance frequency of a resonator connected in another parallel line.

In the acoustic wave device according to the embodiment of the present invention, the resonance frequency of the compensating resonator may be higher than or equal to a resonance frequency of a resonator connected in a series line in the ladder-type filter.

In the acoustic wave device according to the embodiment of the present invention, the compensating resonator may have a capacitance that is greater than a capacitance of another resonator.

A second acoustic wave device disclosed in the present application is an acoustic wave device including a ladder-type filter in which a plurality of resonators are connected, wherein the acoustic wave device further comprises a compensating resonator that is parallel-connected to a series line in the ladder-type filter, and the compensating resonator has a resonance frequency that is in a range of from a resonance frequency of a resonator connected in a parallel line to a resonance frequency of a resonator connected in the series line, inclusive.

In the acoustic wave device according to the embodiment of the present invention, the compensating resonator may be bridge-connected to the series line.

The acoustic wave device according to the embodiment of the present invention may further include a switching unit able to switch operating of the compensating resonator between ON and OFF. Using the acoustic wave device having the above structure enables realizing, for example, a variable band filter that is compatible with a plurality of frequency domains.

In the acoustic wave device according to the embodiment of the present invention, the compensating resonator may include a plurality of resonators that have mutually different resonance frequencies, and the acoustic wave device may further include a switching unit that selectively causes one of plurality of resonator to be in a conduction condition.

The acoustic wave device according to the embodiment of the present invention may further include a switching unit able to switch a passband of the compensating resonator.

In the acoustic wave device according to the embodiment of the present invention, the switching unit may be a Micro Electro Mechanical System (MEMS) switch.

In the acoustic wave device according to the embodiment of the present invention, the resonators and the compensating resonator may each be a film bulk acoustic resonator.

In the acoustic wave device according to the embodiment of the present invention, the resonators and the compensating resonator may each be a surface acoustic wave resonator.

A duplexer according to the embodiment of the present invention includes the above-described acoustic wave device.

A communication module according to the embodiment of the present invention includes the above-described duplexer.

A communication apparatus according to the embodiment of the present invention includes the above-described communication module.

Embodiment

1. Acoustic Wave Device Structure

The present embodiment describes an acoustic wave device of the present invention, taking the example of a filter such as a band-pass filter included in a communication apparatus.

FIG. 1 is a circuit diagram of a first structure of a filter in the embodiment. The filter illustrated as FIG. 1 includes resonators S1 to S4 that are connected in a series line that connects an input port 1 and an output port 2, and resonators P1 to P4 that are parallel-connected to the series line. The resonance frequency of the resonator P4 has a different value from the resonance frequency of the resonator P2. The resonator P4 works as a capacitance at the frequency band at which the resonator P2 is resonating, and therefore the resonance frequency of the resonator P2 is shifted toward the high frequency side in appearance. At the anti-resonance frequency of the resonator P2, the impedance of the resonator P2 is infinity (ideal state), and the impedance of the resonator P4 does not have much influence on the characteristic. Note that the resonator P4 (illustrated as FIG. 1) is an example of the compensating resonator of the present invention.

Figure 2:
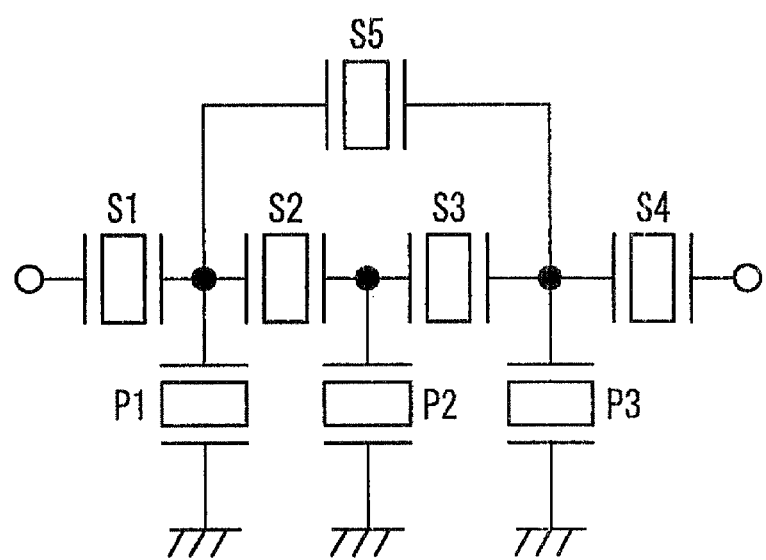
FIG. 2 is a circuit diagram of an acoustic wave device according to the embodiment.

FIG. 2 is a circuit diagram of a second structure of a filter in the embodiment. The filter illustrated as FIG. 2 includes resonators S1 to S4 that are connected in a series line that connects an input port 1 and an output port 2, and resonators P1 to P3 that are parallel-connected to the series line. The filter illustrated as FIG. 2 furthermore includes a resonator S5 that is bridge-connected to the series line. The structure of the filter illustrated as FIG. 2 is a star-delta transformation of the filter structure illustrated as FIG. 1. The resonance frequency of the resonator S5 has a different value from the resonance frequency of the resonator S2. The skirt characteristic can be improved in the filter illustrated as FIG. 2 as well. Note that the resonator S5 is an example of the compensating resonator of the present invention.

The following describes principles of the filters of the present embodiment.

Figure 3A:
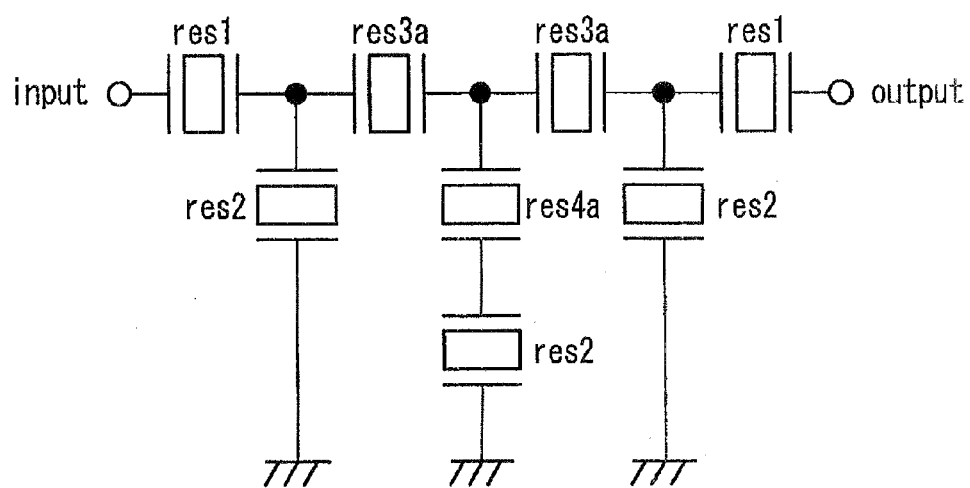
FIG. 3A is a circuit diagram of an acoustic wave device for describing a principle of the embodiment.

FIG. 3A is a circuit diagram for describing a principle of the filter illustrated as FIG. 1. Resonators are connected together in the filter illustrated as FIG. 3A, in the same way as in the filter illustrated as FIG. 1. The resonators (illustrated as FIG. 3A) can be realized FBARs, SAW resonators, etc. Note that a resonator res4a illustrated as FIG. 3A is an example of the compensating resonator of the present invention. The resonators illustrated as FIG. 3A are FBARs using an AlN piezoelectric thin film. The resonance frequency of the two resonators res3a and the resonance frequency of the resonator res4a have the same value. The resonance frequency of the resonator res4a and the resonance frequency of the resonators res2 have different values.

Figure 3B:
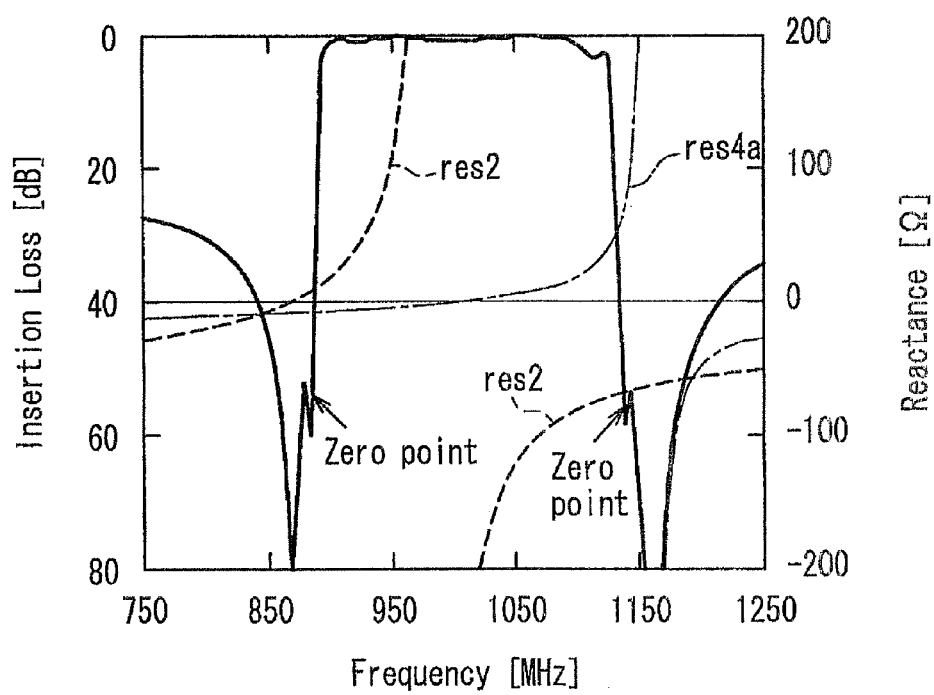
FIG. 3B is a characteristic diagram of a frequency characteristic of the acoustic wave device illustrated as FIG. 3A.

FIG. 3B is the frequency characteristics of the filter and resonators (illustrated as FIG. 3A), the resonators realized by SAW resonators using a LiNbO$_3$ (lithium niobate) substrate. The solid line in FIG. 3B is the frequency characteristic of the filter illustrated as FIG. 3A. The frequency characteristics of the resonators res2 and the resonator res4a are plotted in FIG. 3B. Note that resonators that have been given the same reference number have the same resonance frequency and capacitance.

In the filter illustrated as FIG. 3A, changing the resonance frequency and capacitance of the resonators res2 and resonator res4a enables arbitrarily changing the frequency when the sum of the reactance of the resonators res2 and resonator res4a is zero (hereinafter, called the zero point).

Figure 4A:
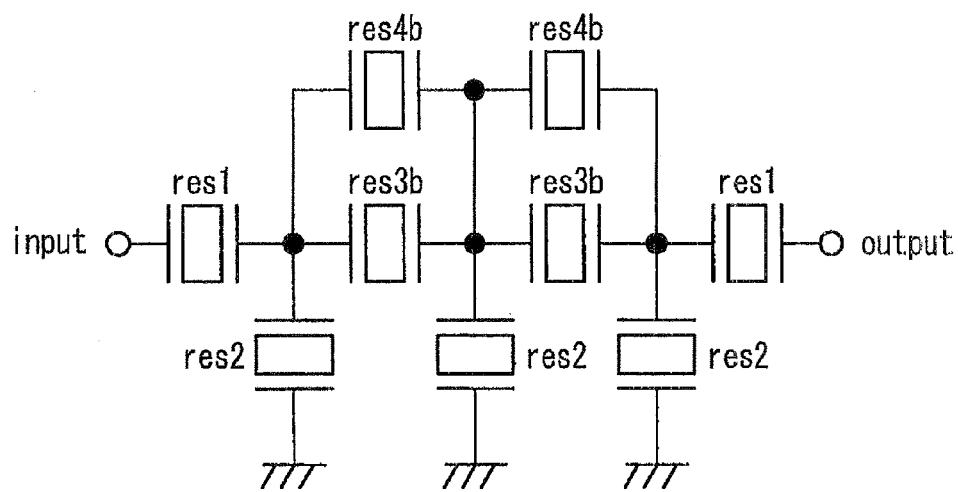
FIG. 4A is a circuit diagram of an acoustic wave device for describing a principle of the embodiment.

FIG. 4A is a circuit diagram for describing a principle of the filter illustrated as FIG. 2. The filter (illustrated as FIG. 4A) is the same as the filter illustrated as FIG. 2 in the sense that resonators are bridge-connected to the series line, but the specific connection configuration is different. The resonators can be FBARs or SAW resonators. Note that the resonator res4b is an example of the compensating resonator of the present invention. In the filter illustrated as FIG. 4A, two resonators res4b are bridge-connected to the series line. The resonance frequency of the resonators res2 and the resonance frequency of the resonators res4b have the same value. The resonance frequency of the resonators res2 and the resonance frequency of resonators res3b have different values. The resonance frequency of the resonators res3b and the resonance frequency of the resonators res4b have different values.

Figure 4B:
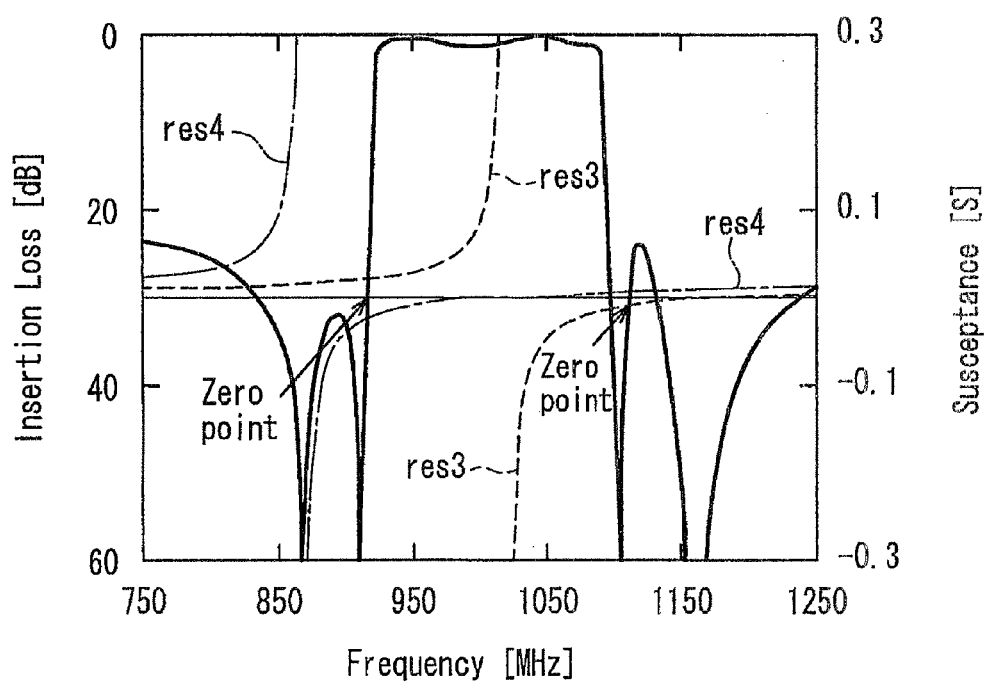
FIG. 4B is a characteristic diagram of a frequency characteristic of the acoustic wave device illustrated as FIG. 4A.

FIG. 4B is the frequency characteristics of the filter and resonators (illustrated as FIG. 4A), the resonators realized by SAW resonators using a LiNbO$_3$ (lithium niobate) substrate. The solid line in FIG. 4B is the frequency characteristic of the filter illustrated as FIG. 4A. The frequency characteristics of the resonators 3b and the resonators res4b are plotted in FIG. 4B. In the filter illustrated as FIG. 4A, changing the resonance frequency and capacitance of the resonators res3b and the resonance frequency and capacitance of the resonators res4b enables arbitrarily changing the frequency at the zero point where the sum of the reactance is zero.

Working Example 1

Figure 5A:
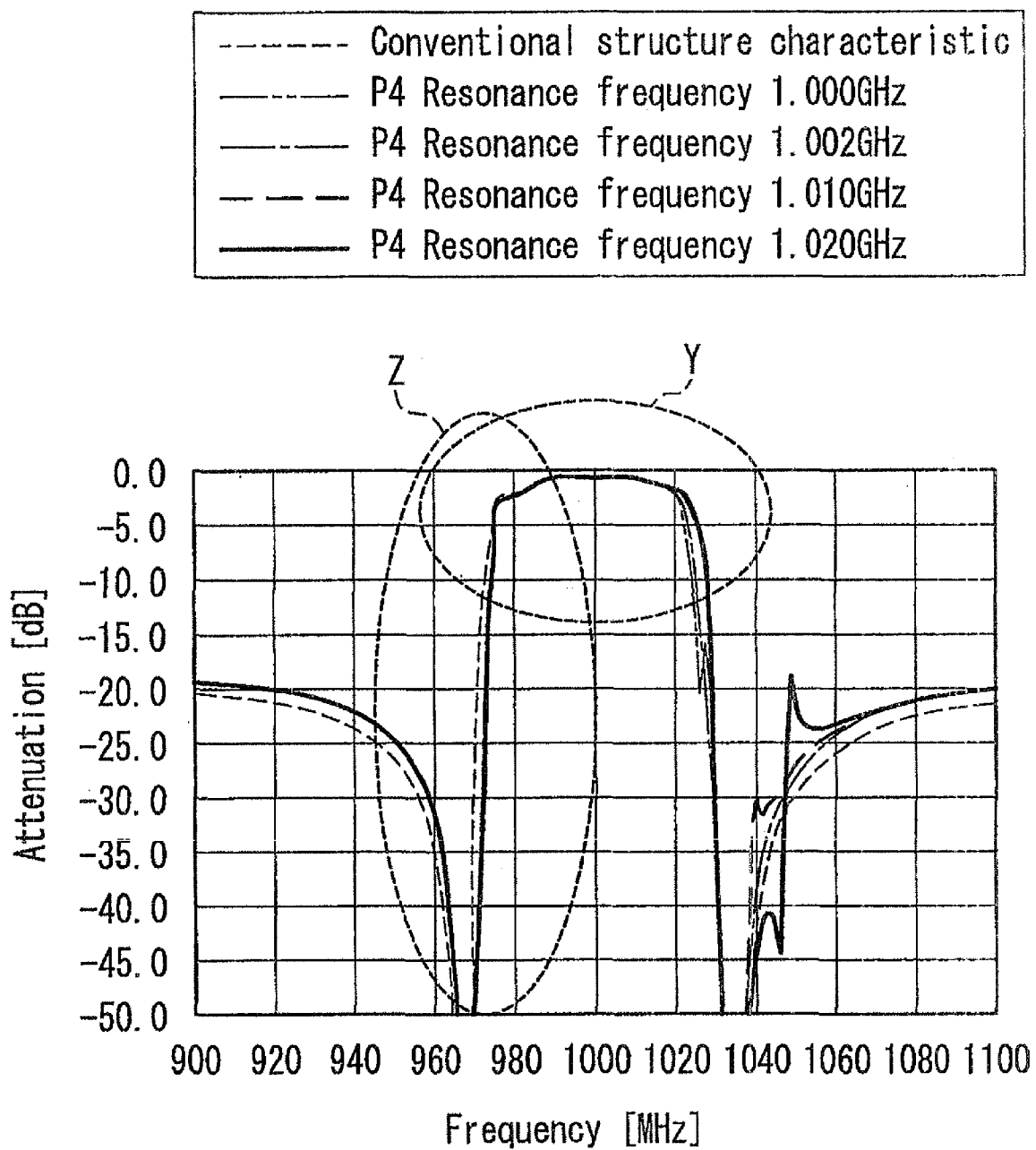
FIG. 5A is a characteristic diagram of a frequency characteristic in working example 1.

FIG. 5A is the frequency characteristic of the filter illustrated as FIG. 1 when the resonance frequency of the resonator P4 has been changed, and the frequency characteristic of a conventional filter.

The resonators of the present working example were realized by FBARs using an AlN piezoelectric thin film. The constants of the resonators were as follows: capacitance ratio y=16, quality factor Q=800, resonance frequency of resonators S1 to S4=1.002 GHz, resonance frequency of resonators P1 to P3=0.968 GHz, capacitance of resonators S1 and S4=6.4 pF, capacitance of resonators S2, S3, and P1 to P3=3.2 pF, capacitance of resonator P4=10 pF. The frequency characteristic of the filter was measured when the resonance frequency of the resonator P4 was changed to 1.000 GHz, 1.002 GHz, 1.010 GHz, and 1.020 GHz.

Illustrated as FIG. 5A, if the resonance frequency of the resonator P4 is lower than the resonance frequency of the other series-line resonators (1.002 GHz), that is to say, if the resonance frequency of the resonator P4 is 1 GHz, band-loss appears prominently on the high frequency side of the passband. It is more effective to set the resonance frequency of the resonator P4 to a value greater than or equivalent to the resonance frequency of the series-line resonators. It is effective for the capacitance of the resonator P4 to be greater than the capacitance of the resonator P2.

Figure 5B:
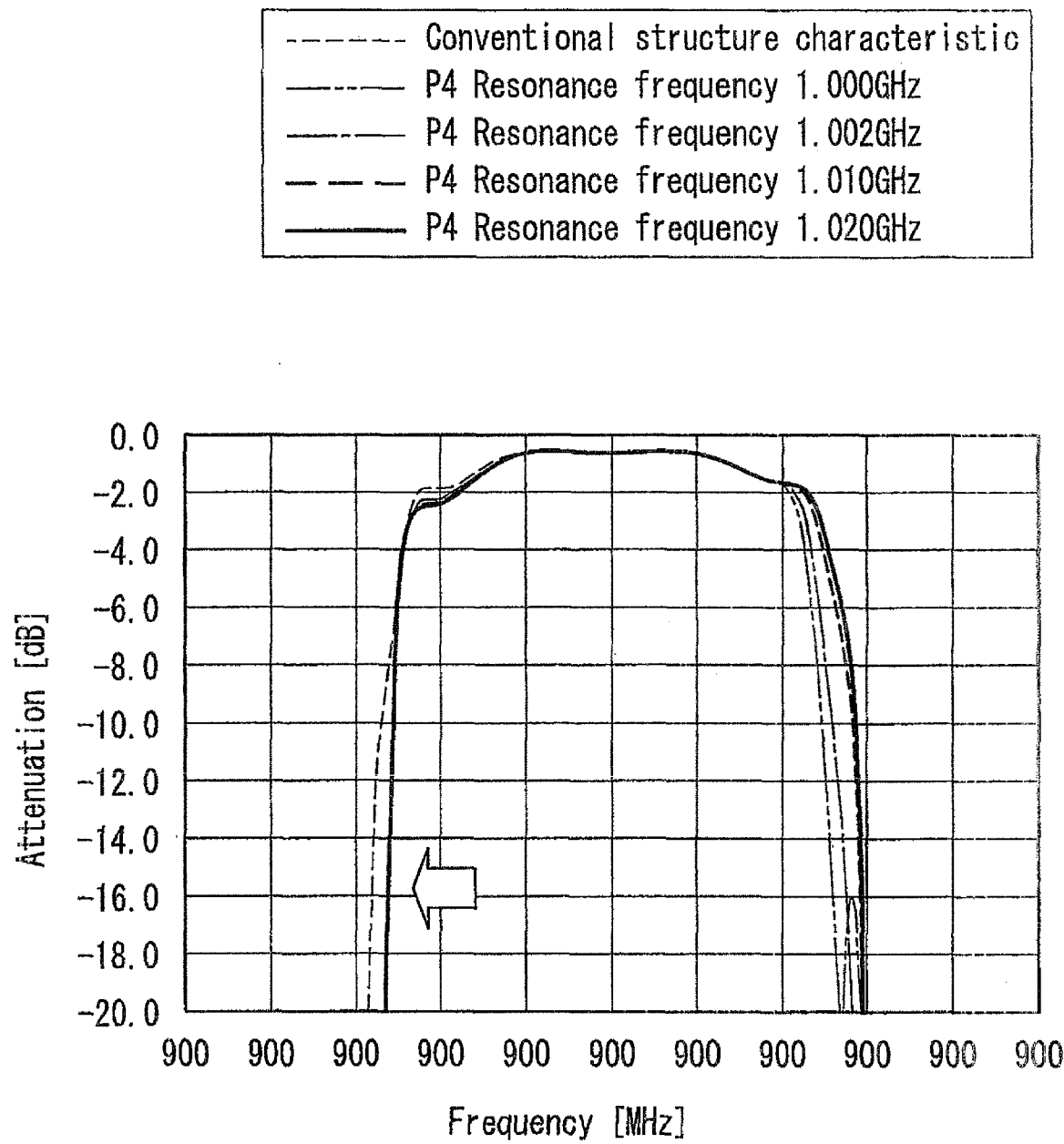
FIG. 5B is an enlarged view of portion Y in FIG. 5A.
Figure 5C:
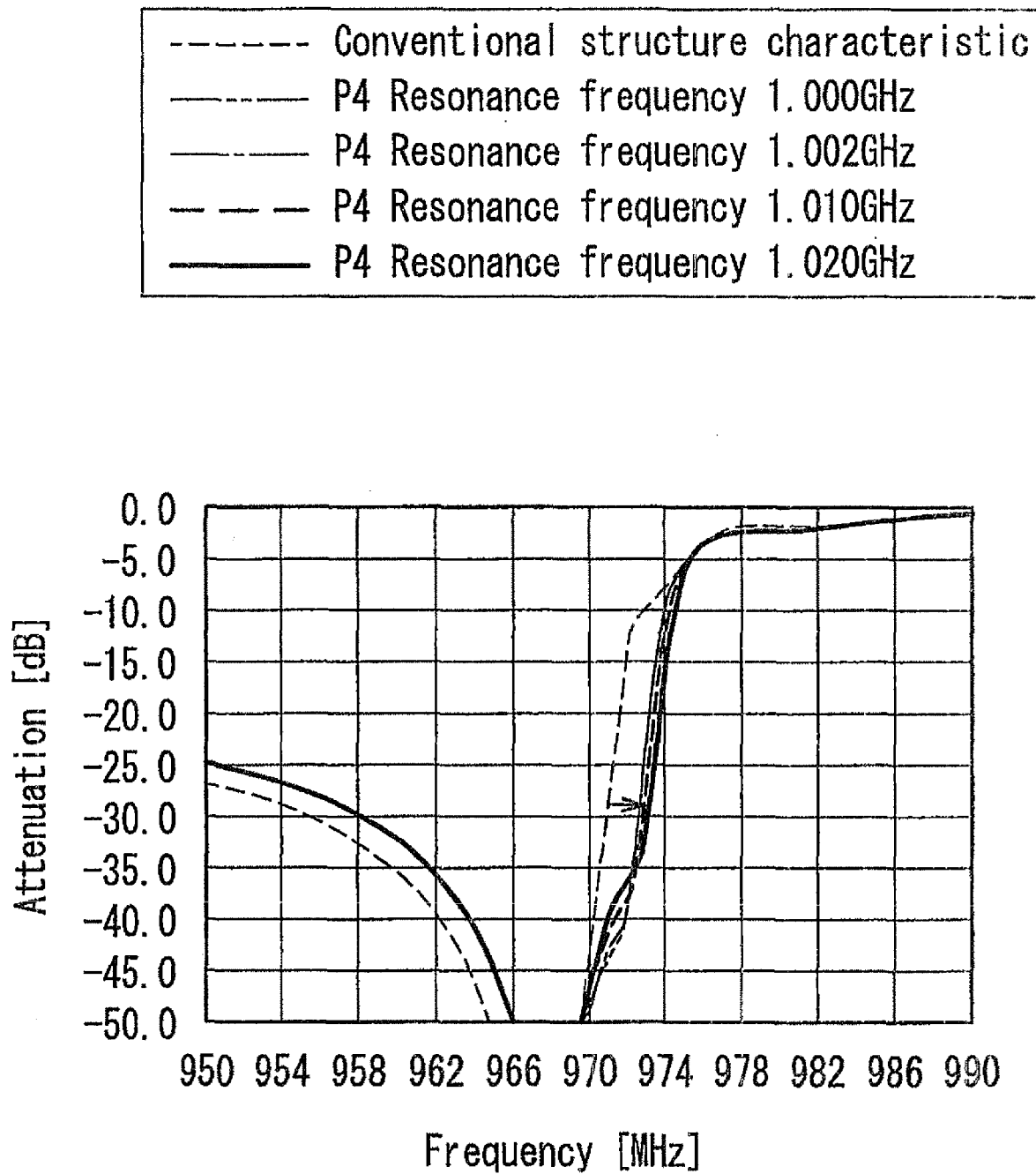
FIG. 5C is an enlarged view of portion Z in FIG. 5A.

FIG. 5B is an enlarged view of portion Y in FIG. 5A. FIG. 5C is an enlarged view of portion Z in FIG. 5A. Illustrated as the portions designated by arrows in FIGS. 5B and 5C, it is understood that adding the resonator P4 to the filter enables improving the sharpness of the frequency characteristic, compared to the frequency characteristic of the filter in which the resonator P4 is not connected.

Also, the sharpness of the frequency characteristic of the filter can be changed since changing the resonance frequency of the resonator P4 enables changing the frequency at the zero point as described with reference to FIGS. 3A and 3B. In particular, it is understood that setting the resonance frequency of the resonator P4 to 1.002 GHz enables realizing a filter having the most superior skirt characteristic.

Also, it is understood that setting the resonance frequency higher than the resonance frequencies of the series-line resonators (the resonance frequency of the resonator P4 to 1.002 GHz or higher), enables nearly completely ensuring the band on the high frequency side of the passband while improving the skirt characteristic on the low frequency side of the passband.

Working Example 2

Figure 6:
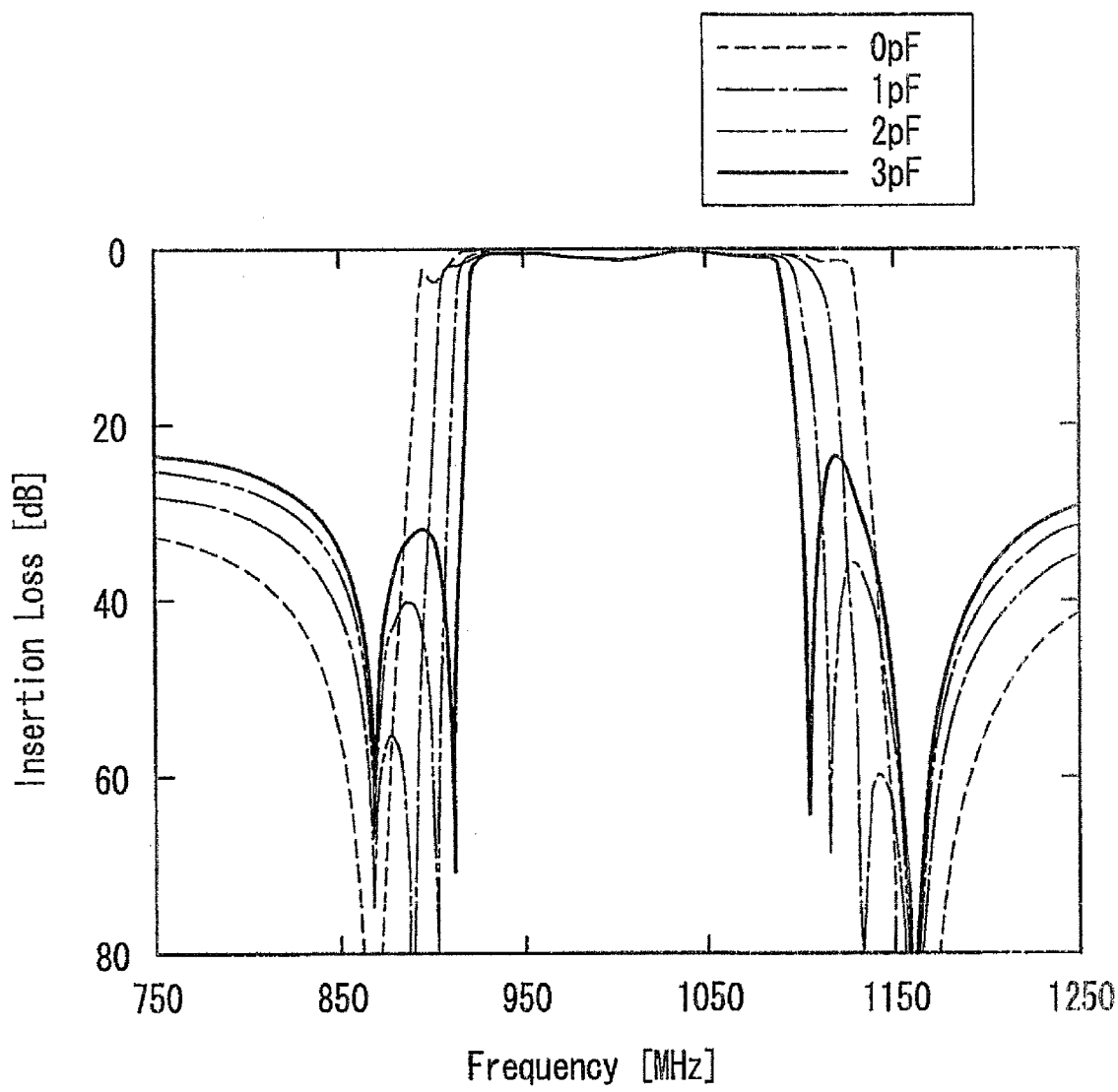
FIG. 6 is a frequency characteristic in working example 2.

FIG. 6 is the frequency characteristic when the electrode area ratio in the resonators has been changed. FIG. 6 is the frequency characteristic when the resonators res4b illustrated as FIG. 4A have been realized by resonators using a 15°Y plate LN substrate, and the capacitance of the resonators res4b have been changed to 0 pF, 1 pF, 2 pF, and 3 pF.

Illustrated as FIG. 6, the smaller the capacitance of the resonators res4b, the wider the passband width of the filter becomes, and the larger the capacitance of the resonators res4b, the narrower the passband width of the filter becomes. Accordingly, the capacitance of the resonators res4b can be increased in order to make the passband width of the filter narrower.

Working Example 3

Figure 7A:
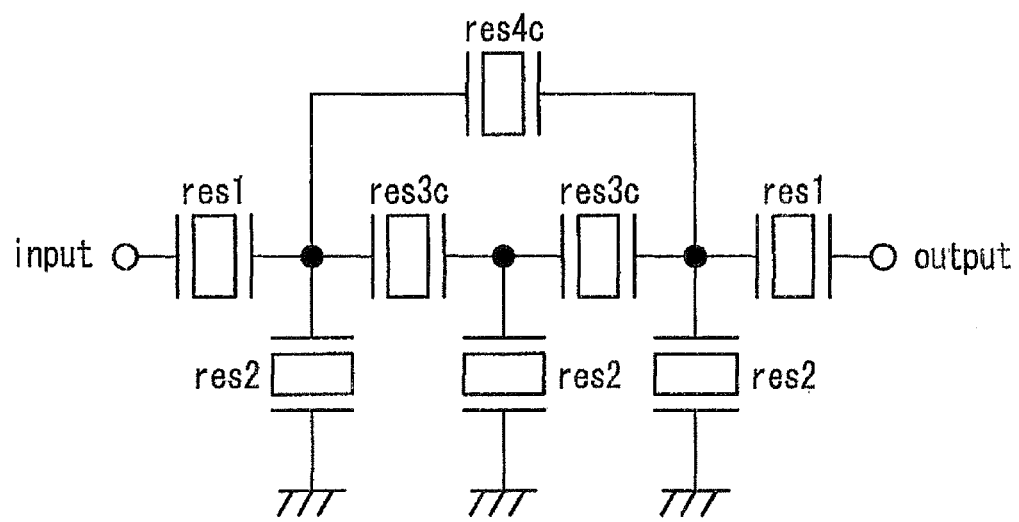
FIG. 7A is a circuit diagram of an acoustic wave device for describing a principle of working example 3.

FIG. 7A is a specific structure of the filter illustrated as FIG. 2. Although the connection configuration between the resonators of the filter illustrated as FIG. 7A is the same as in FIG. 2, the resonance frequency of the resonators res3c and the resonance frequency of the resonator res4c have different values, and the resonance frequency of the resonator res4c and the resonance frequency of the resonators res2 have the same value. Note that the resonator res4c in FIG. 7A is an example of the compensating resonator of the present invention.

Figure 7B:
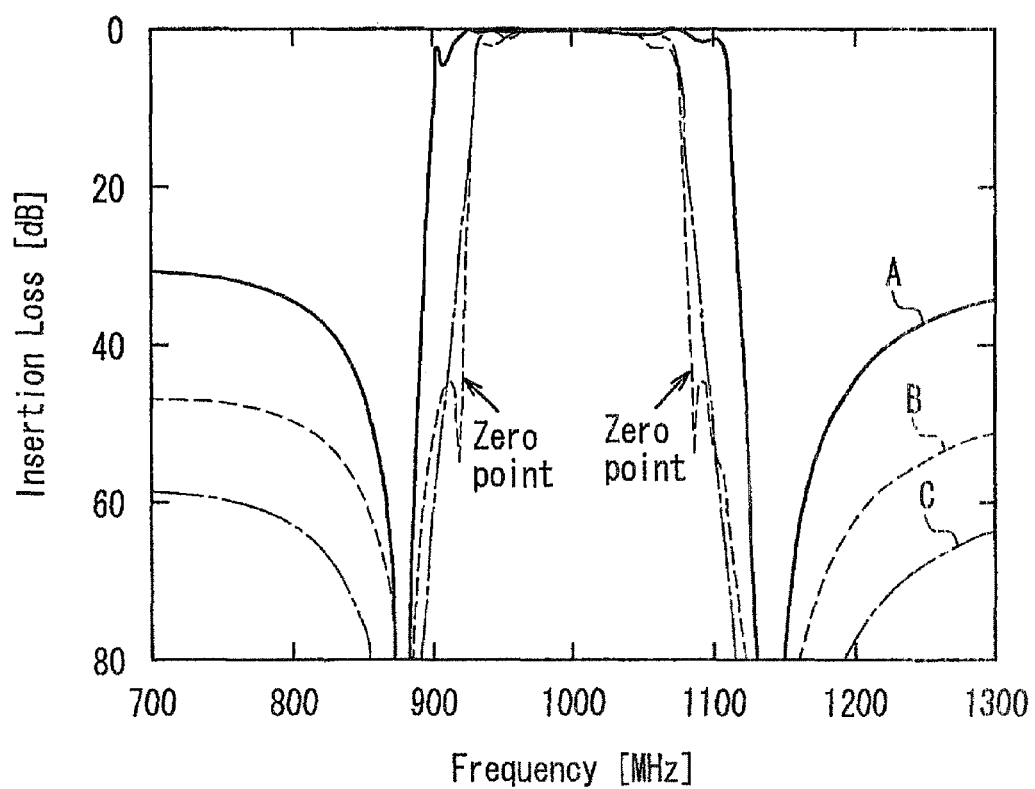
FIG. 7B is a frequency characteristic of the acoustic wave device illustrated as FIG. 7A.

FIG. 7B is the frequency characteristic of the filter illustrated as FIG. 7A. Characteristic A in FIG. 7B is the frequency characteristic of the filter when the resonator res4c is not connected and the capacitance ratio Cp/Cs=0.5. Here, Cp/Cs is the capacitance ratio between ½ the capacitance (Cp) of the resonators res2 connected in parallel lines and the capacitance (Cs) of the resonators res1 connected in the series line. Characteristic B is the frequency characteristic of the filter when the resonator res4c is connected to the series line illustrated as FIG. 7A and the capacitance ratio Cp/Cs=0.5. Characteristic C is the frequency characteristic of the filter when the resonator res4c is not connected and the capacitance ratio Cp/Cs=2.

Although the skirt characteristic of characteristic A is favorable, the passband is a wide band and therefore not suited for narrowband application. Although the passband of characteristic C is narrow, which is favorable, the skirt characteristic has degraded. In contrast, characteristic B is the most preferable specification since the skirt characteristic is favorable and the passband is narrow. In this way bridge-connecting the resonator res4c to the series line of the filter enables realizing a filter whose band can be made narrower without causing degradation of the skirt characteristic.

Working Example 4

Figure 8A:
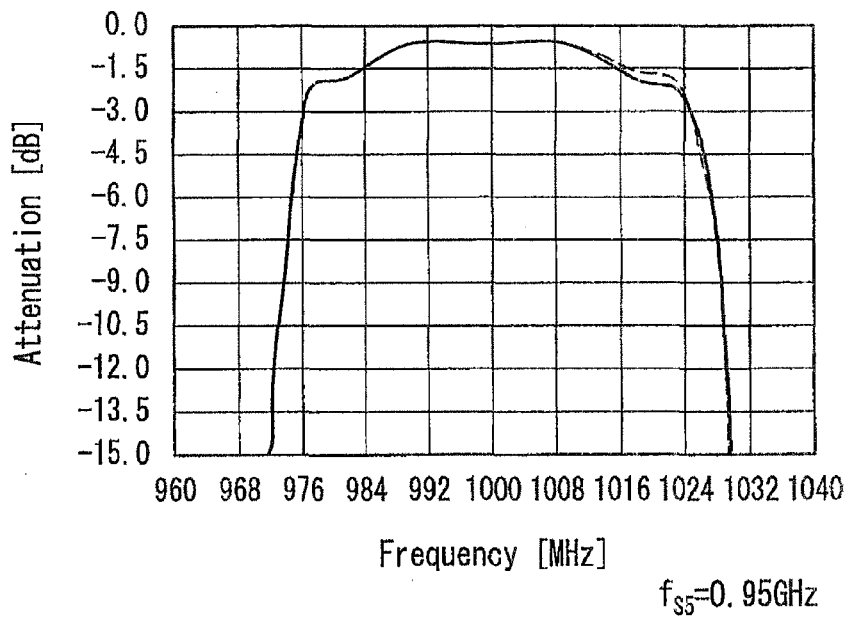
FIG. 8A is a frequency characteristic in working example 4.
Figure 8B:
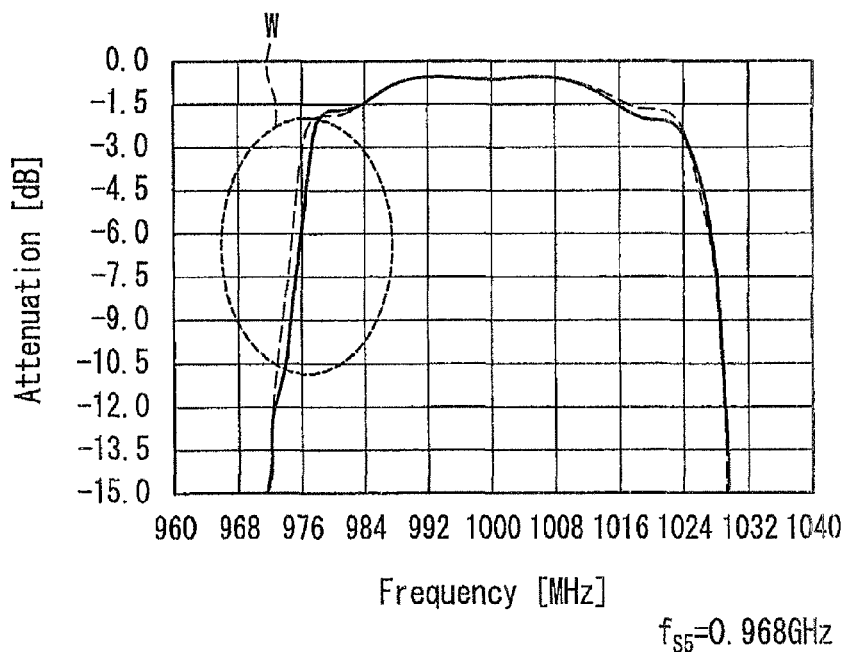
FIG. 8B is a frequency characteristic in working example 4.
Figure 8C:
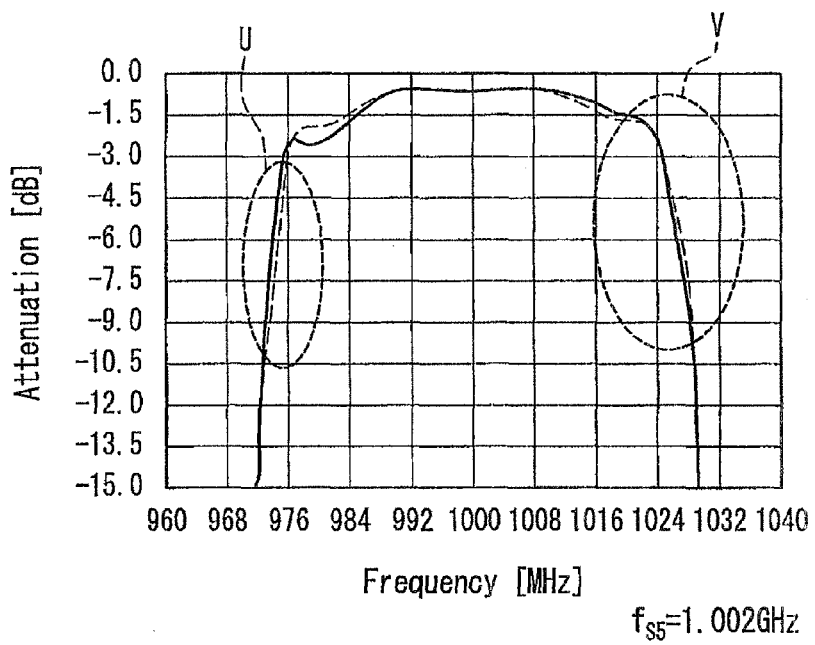
FIG. 8C is a frequency characteristic in working example 4.
Figure 8D:
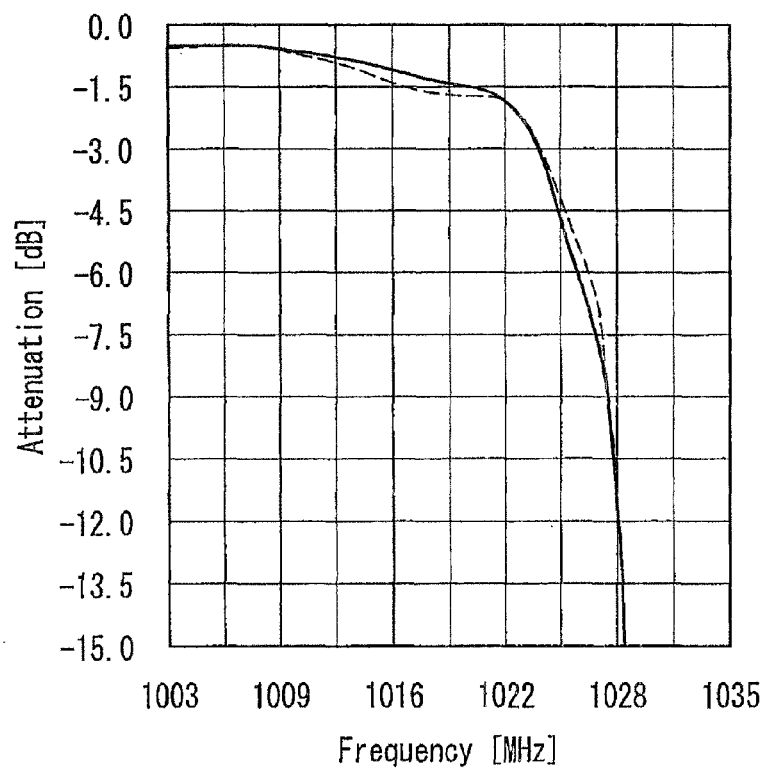
FIG. 8D is an enlarged view of portion V in FIG. 8C.
Figure 17:
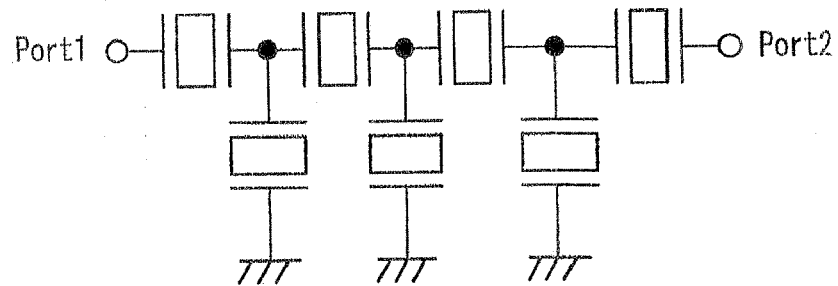
FIG. 17 is a circuit diagram of a conventional ladder-type filter.
Figure 18:
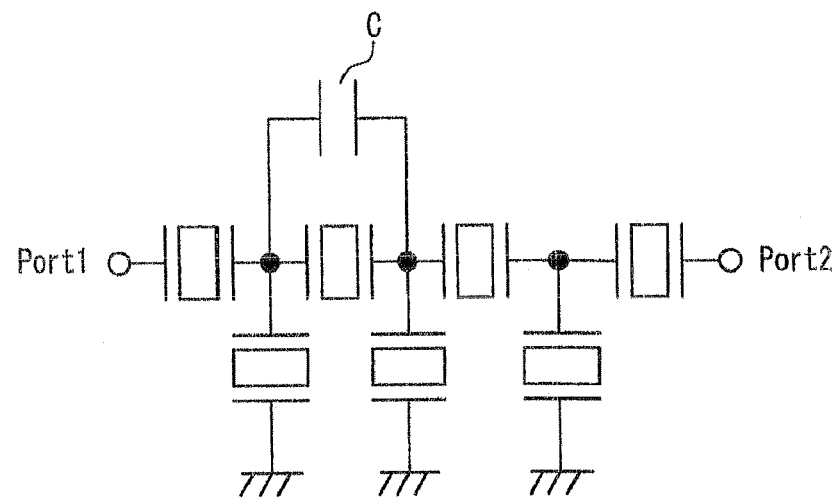
FIG. 18 is a circuit diagram of a conventional ladder-type filter to which a capacitor has been added.
Figure 19:
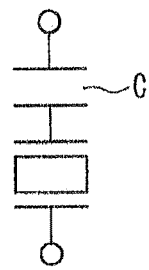
FIG. 19 is a circuit diagram of a conventional resonator to which a capacitor has been connected.
Figure 20A:
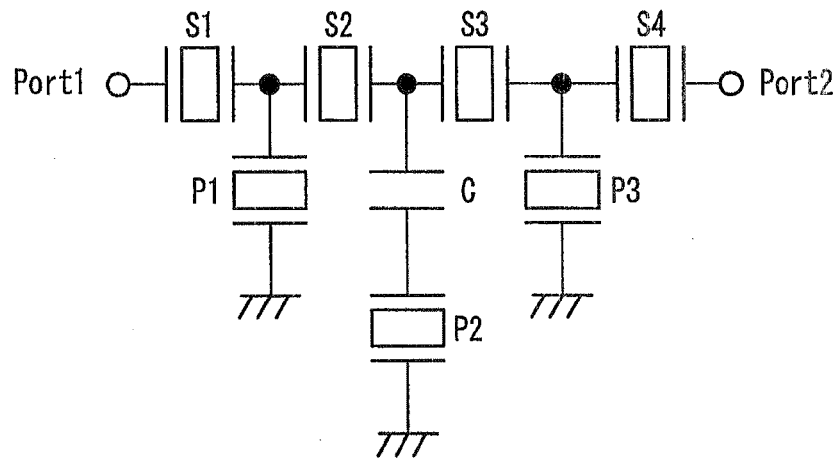
FIG. 20A is a circuit diagram of a conventional ladder-type filter to which a capacitor has been added.
Figure 20B:
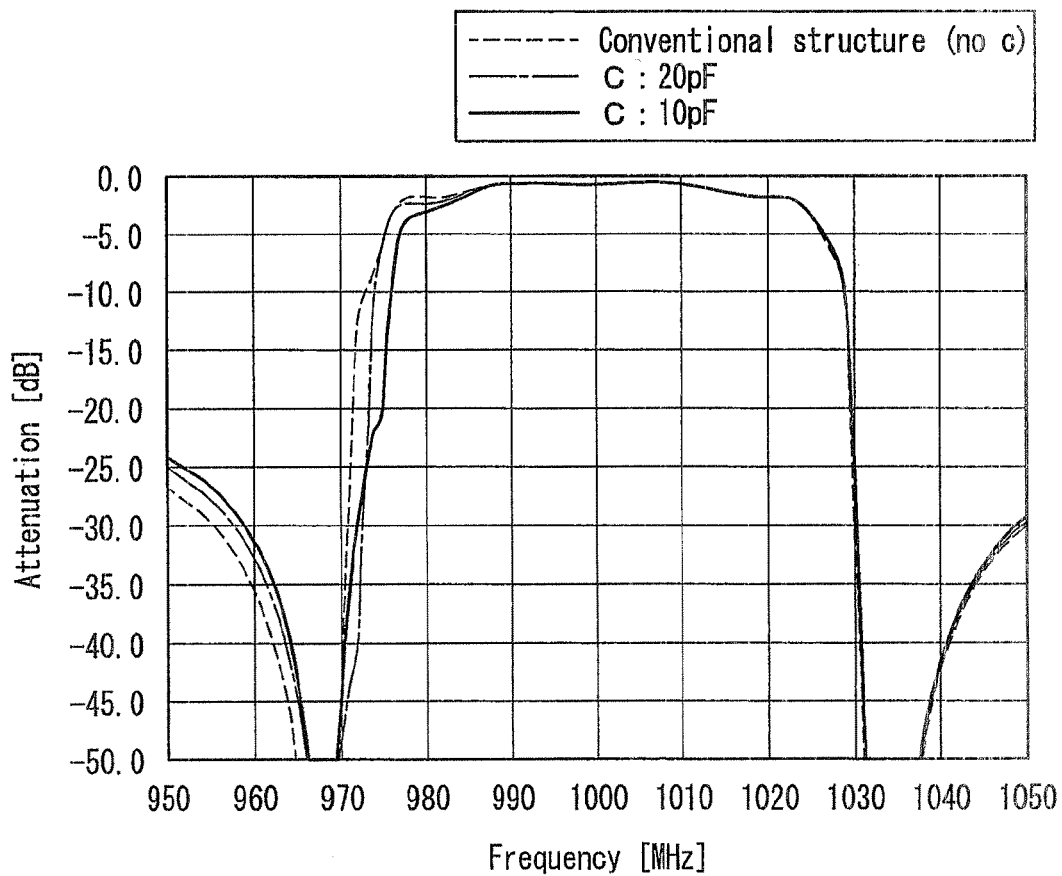
FIG. 20B is a frequency characteristic of the ladder-type filter illustrated as FIG. 20A.

FIG. 8A is the frequency characteristic of the filter illustrated as FIG. 2 when the resonance frequency of the resonator S5 has been set to 0.95 GHz. FIG. 8B is the frequency characteristic of the filter illustrated as FIG. 2 when the resonance frequency of the resonator S5 has been set to 0.968 GHz. FIG. 8C is the frequency characteristic of the filter illustrated as FIG. 2 when the resonance frequency of the resonator S5 has been set to 1.002 GHz. FIG. 8D is an enlarged view of portion V in FIG. 8C. Characteristics indicated by solid lines in FIGS. 8A to 8D are the characteristics of the present working example, and characteristics indicated by broken lines are the characteristics of a conventional filter (see FIG. 17).

Illustrated as FIG. 8A, when the resonator S5 having a resonance frequency of 0.95 GHz is connected, there is little difference from the frequency characteristic of the conventional filter, and there is not a large improvement in either the skirt characteristic or the bandwidth. As illustrated as FIG. 8B, when the resonator S5 having a resonance frequency of 0.968 GHz is connected, the square shape characteristic at the frequencies on the lower limit side of the passband can be improved illustrated as portion W Illustrated as FIGS. 8C and 8D, when the resonator S5 having a resonance frequency of 1.002 GHz is connected, the skirt characteristic on the high frequency side and low frequency side of the passband can be improved illustrated as portion U and portion V.

Bridge-connecting the resonator having a resonance frequency of 1.002 GHz to the series line of the filter enables realizing a filter having a favorable skirt characteristic. Rippling in the band occurs at frequencies over 1.002 GHz (the resonance frequency of the series-line resonators), which is a problem in terms of characteristics.

Note that although a resonator is connected with respect to only one set of parallel lines in the present working example, the present working example may be applied to a plurality of parallel lines.

Although the above description pertains to the characteristics of filters, the same effects can be obtained by applying the acoustic wave devices of the present embodiment and above working examples to a duplexer. Furthermore, an improvement in device performance, such as an improvement in reception sensitivity can be expected by using such acoustic wave devices in a terminal such as a mobile phone. The following describes examples of employing the acoustic wave devices of the present embodiment and above working examples.

2. Variable Band Filter Structure

An acoustic wave device of the present embodiment can be structured so as to switch between resonators having mutually different passbands with use of a switching unit. The following describes specific working examples of this structure.

Working Example 1

Figure 9A:
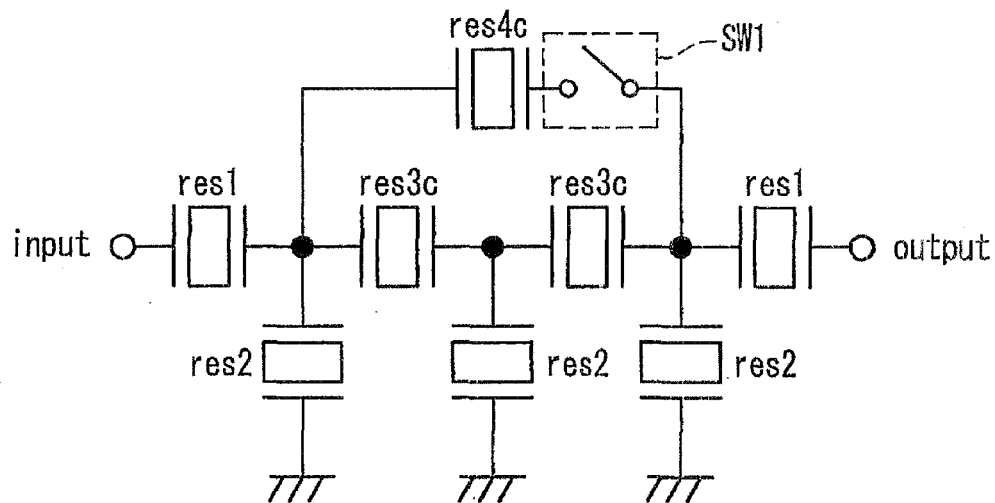
FIG. 9A is a circuit diagram of working example 1 of a variable band filter according to the embodiment.

FIG. 9A is a first working example of a variable band filter. Illustrated as FIG. 9A, the filter of the present working example is a ladder-type filter. The filter illustrated as FIG. 9A includes a switch SW1 that is connected in series to the resonator res4c. The filter (illustrated as FIG. 9A) is the same as the filter illustrated as FIG. 7A, with the addition of the switch SW1.

Figure 9B:
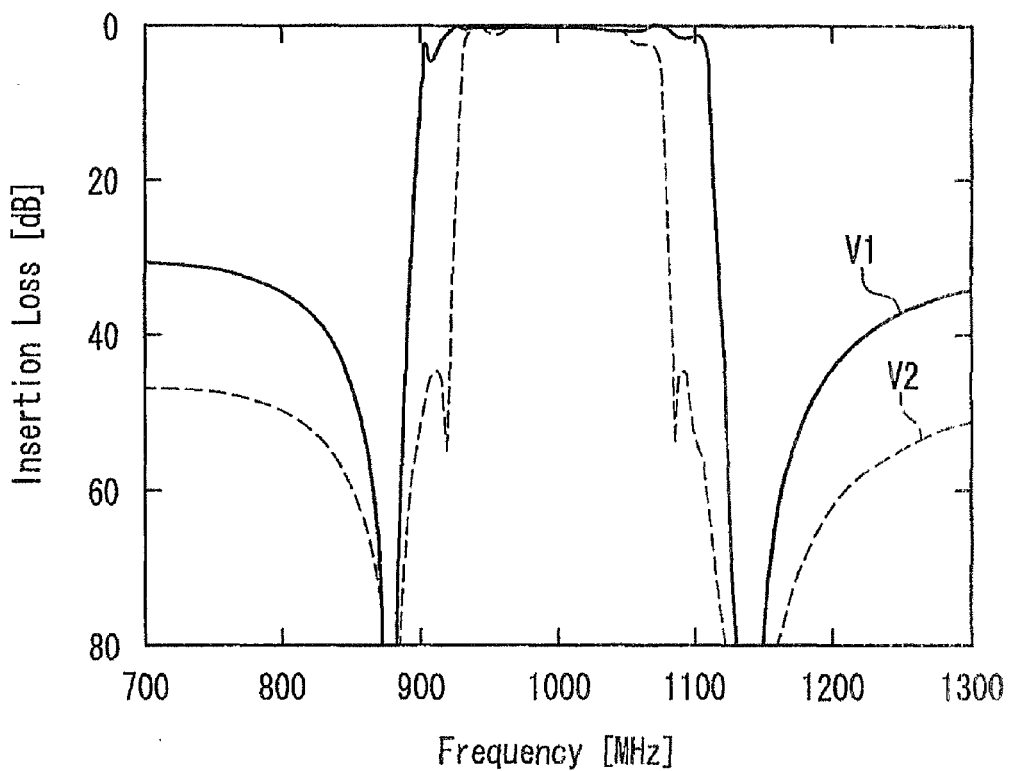
FIG. 9B is a frequency characteristic in working example 1.

FIG. 9B is results of calculating frequency characteristics when the switch SW1 is in an ON condition and an OFF condition. The frequency characteristics illustrated as FIG. 9B were calculated in a case of the resonator res4c operating as a resonator when the switch SW1 is in the ON condition, and in a case of the resonator 4c being in a completely open condition when the switch SW1 is in the OFF condition. Characteristic V1 illustrated as FIG. 9B is the frequency characteristic of the filter when the switch SW1 is in the OFF condition and the resonator res4c is in the open condition, and the capacitance ratio Cp/Cs=0.5. Here, Cp/Cs is the capacitance ratio between ½ the capacitance (Cp) of the resonators res2 that are connected in parallel lines and the capacitance (Cs) of the resonators res1 that are connected in the series line. Characteristic V2 is the frequency characteristic of the filter when the switch SW1 is in the ON condition and the resonator res4c is in the operating condition, and the capacitance ratio Cp/Cs=0.5. In this way, switching the switch SW1 from the OFF condition to the ON condition enables making the passband of the filter narrower.

Figure 10:
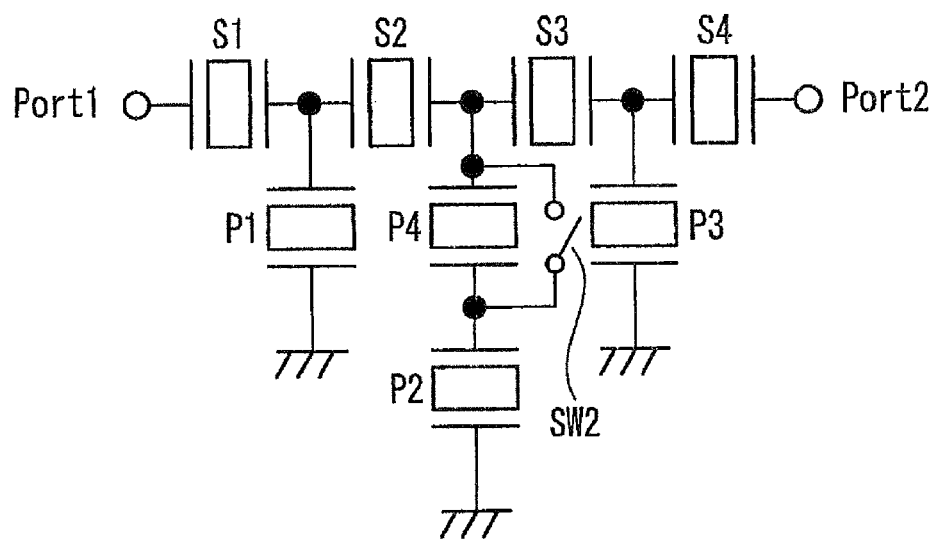
FIG. 10 is a circuit diagram of working example 1 of a variable band filter according to the embodiment.

FIG. 10 is a variation of a variable band filter according to the present embodiment. In the filter illustrated as FIG. 10, a switch SW2 is connected in parallel to the resonator P4 that is connected in a parallel line. The filter (illustrated as FIG. 10) is the same as the filter illustrated as FIG. 1, with the addition of the switch SW2. When the switch SW2 is in the ON condition, the resonator P4 is in a short circuit condition, and when the switch SW2 is in the OFF condition, the resonator P4 is in the operating condition. Accordingly switching the switch SW2 from the ON condition to the OFF condition enables making the passband of the filter narrower. The frequency characteristics of the variable band filter (illustrated as FIG. 10) are nearly the same as the frequency characteristics illustrated as FIG. 9B.

Note that in the present working example, the resonator res4c (FIG. 9A) and the resonator P4 (FIG. 10) are examples of the compensating resonator of the present invention. In the present working example, the switches SW1 and SW2 are examples of the switching unit of the present invention.

Working Example 2

Figure 11A:
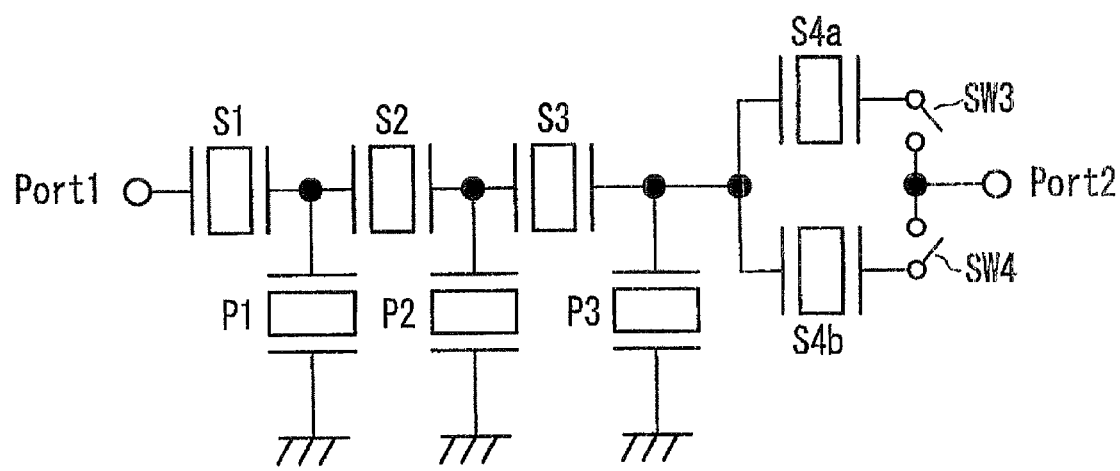
FIG. 11A is a circuit diagram of working example 2 of a variable band filter according to the embodiment.
Figure 11B:
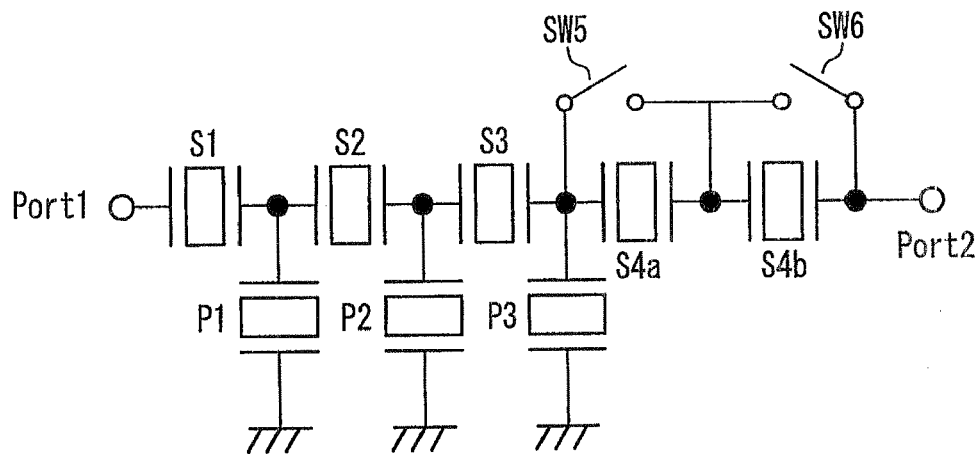
FIG. 11B is a circuit diagram of working example 2 of a variable band filter according to the embodiment.

FIGS. 11A and 11B are a second working example of a variable band filter. The variable band filter illustrated as FIG. 11A and the variable band filter illustrated as FIG. 11B differ only with respect to the connection configuration between resonators S4a and S4b and switches SW3 to SW6, and effects obtained by these filters are the same. In FIGS. 11A and 11B, the resonance frequencies of the resonators S1, S2, S3, and S4a connected in the series line all have the same value. The resonance frequency of the resonator S4b has a value that is lower than the resonance frequency of the resonator S4a.

In the variable band filter illustrated as FIG. 11A, the switches SW3 and SW4 are both switch-controlled so that when one of them is ON the other is OFF. When the switch SW3 is in the ON condition and the switch SW4 is in the OFF condition, the resonator S4a is in the operating condition and the resonator S4b is in the open condition. Also, when the switch SW3 is in the OFF condition and the switch SW4 is in the ON condition, the resonator S4a is in the open condition and the resonator S4b is in the operating condition.

In the variable band filter illustrated as FIG. 11B, the switches SW5 and SW6 are both switch-controlled so that when one of them is ON the other is OFF. When the switch SW5 is in the ON condition and the switch SW6 is in the OFF condition, the resonator S4a is in the short circuit condition and the resonator S4b is in the operating condition. Also, when the switch SW5 is in the OFF condition and the switch SW6 is in the ON condition, the resonator S4a is in the operating condition and the resonator S4b is in the short circuit condition.

Figure 11C:
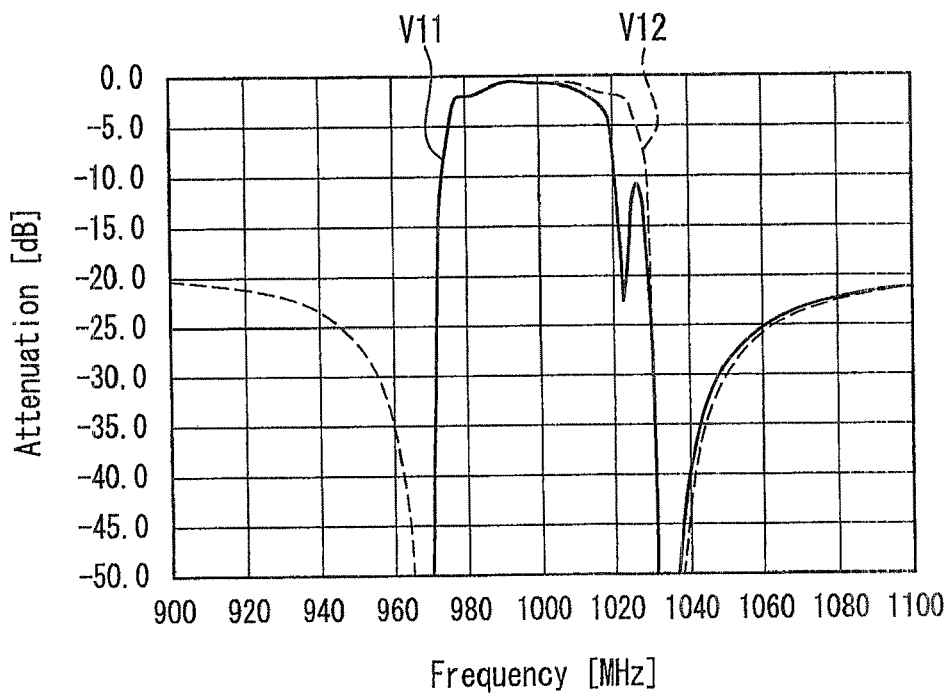
FIG. 11C is a frequency characteristic in working example 2.

FIG. 11C is results of calculating frequency characteristics in the variable band filters illustrated as FIGS. 11A and 11B. The calculation results illustrated as FIG. 11C were calculated in a case of realizing the resonators S1 to S4b and P1 to P3 in the variable band filter by SAW resonators using a $LiNbO_3$ (lithium niobate) substrate. In the variable band filters illustrated as FIGS. 11A and 11B, when the resonator S4a is in a non-operating condition (open condition or short circuit condition) and the resonator S4b is in the operating condition, the passband on the high frequency side becomes narrow, illustrated as characteristic V11 in FIG. 11C. Also, when the resonator S4a is in the operating condition and the resonator S4b is in a non-operating condition, the passband on the high frequency side becomes wide illustrated as characteristic V12 in FIG. 11C. In this way the bandwidth on the high frequency side of the filter's passband can be changed by controlling the ON/OFF condition of the switches SW3 and S4 illustrated as FIG. 11A and the switches SW5 and SW6 illustrated as FIG. 11B.

Note that although the switches SW3 to SW6 are semiconductor switches in the present working example, the same effects as in the present working example can be obtained even if the switches SW3 to SW6 are Micro Electro Mechanical System (MEMS) switches.

The filters of the present working example are not limited to a variable band filter. The filters of the present working example can also be applied to a duplexer.

Also, although the resonators S1 to S4b and P1 to P3 are realized by SAW resonators in the present working example, the same effects as in the present working example can be obtained even if such switches are realized by FBARs.

Also, although the switches SW3 and SW4 are switch-controlled in the present working example so that when one of them is ON the other is OFF, the same effects as in the present working example can be obtained even in a case of including an operating mode in which both switches are ON simultaneously.

The resonators S4a and S4b of the present working example are examples of the compensating resonator of the present invention. The switches SW3 to SW6 of the present working example are examples of the switching unit of the present invention.

Working Example 3

Figure 12A:
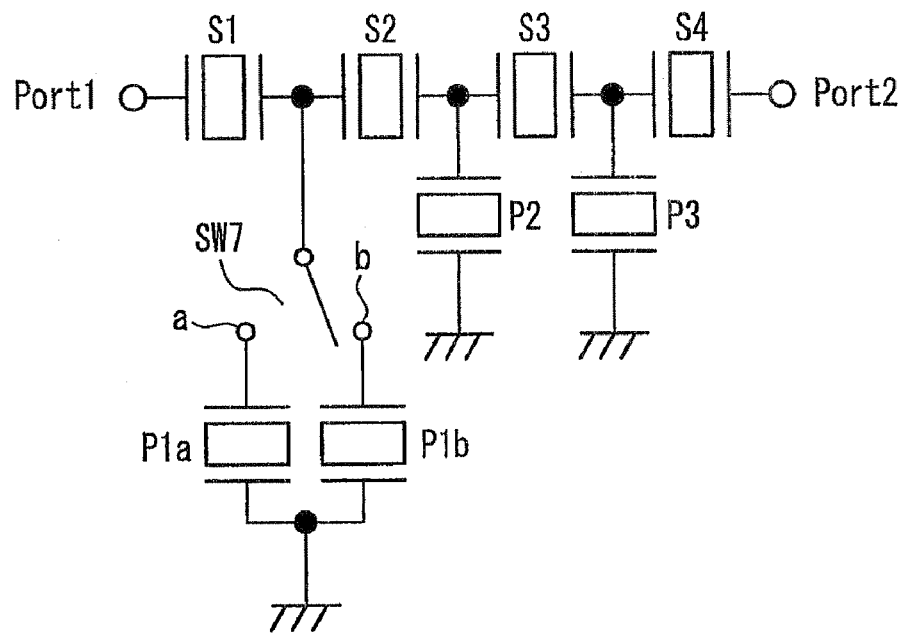
FIG. 12A is a circuit diagram of working example 3 of a variable band filter according to the embodiment.
Figure 12B:
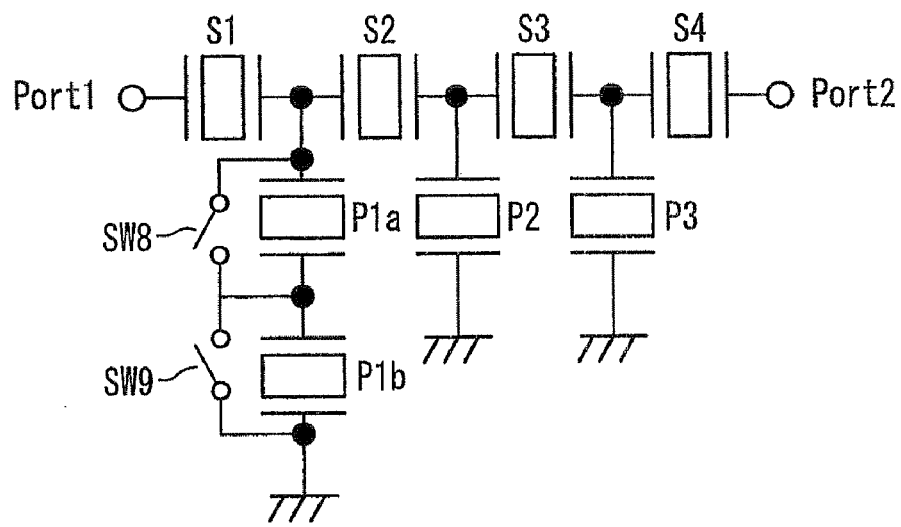
FIG. 12B is a circuit diagram of working example 3 of a variable band filter according to the embodiment.

FIGS. 12A and 12B are circuit diagrams of a third working example of a variable band filter. Although the variable band filters illustrated as FIGS. 12A and 12B differ with respect to the connection method between switches SW7 to SW9 and resonators P1a and P1b, effects obtained by these filters are the same. The resonance frequencies of the resonators P1a, P2, and P3 all have the same value. The resonance frequency of the resonator P1b has a value that is higher than the resonance frequency of the resonator P1a. The switch SW7 illustrated as FIG. 12A is connected so as to selectively switch between a port "a" and a port "b". The switches SW8 and SW9 illustrated as FIG. 12B are switch-controlled so that when one of them is ON the other is OFF.

In FIG. 12A, when the switch SW7 is connected to the port a, the resonator P1a is in the operating condition and the resonator P1b is in the open condition. When the switch SW7 is connected to the port b, the resonator P1a is in the open condition and the resonator P1b is in the operating condition.

In FIG. 12B, when the switch SW8 is in the ON condition and the switch SW9 is in the OFF condition, the resonator P1a is in the short circuit condition and the resonator P1b is in the operating condition. Also, when the switch SW8 is in the OFF condition and the switch SW9 is in the ON condition, the resonator P1a is in the operating condition and the resonator P1b is in the short circuit condition.

Figure 12C:
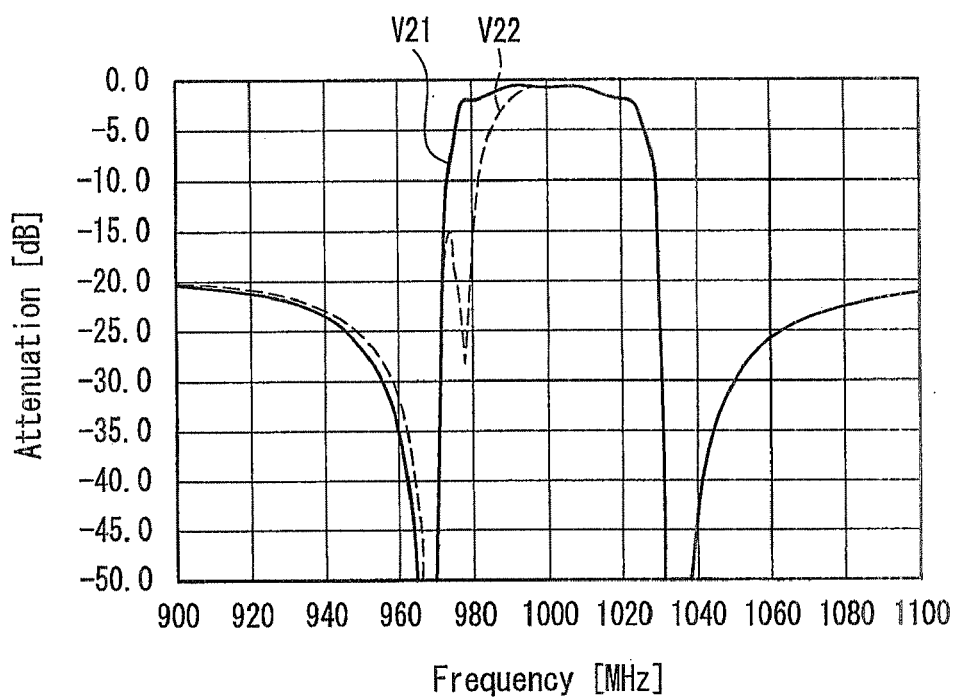
FIG. 12C is a frequency characteristic in working example 3.

FIG. 12C is results of calculating frequency characteristics in the variable band filters illustrated as FIGS. 12A and 12B. The calculation results illustrated as FIG. 12C were calculated in a case of realizing the resonators S1 to S4 and P1a to P3 in the variable band filter by SAW resonators using a LiNbO$_3$ (lithium niobate) substrate.

When the resonator P1a illustrated as FIG. 12A is in the operating condition and the resonator P1b is in the open condition, or when the resonator P1a illustrated as FIG. 12B is in the operating condition and the resonator P1b is in the short circuit condition, the bandwidth on the low frequency side can be widened, illustrated as characteristic V21 in FIG. 12C. When the resonator P1a illustrated as FIG. 12A is in the open condition and the resonator P1b is in the operating condition, the bandwidth on the low frequency side can be made narrower, illustrated as characteristic V22 in FIG. 12C. When the resonator P1a illustrated as FIG. 12B is in the short circuit condition and the resonator P1b is in the operating condition, the bandwidth on the low frequency side can be made narrower, illustrated as characteristic V22 in FIG. 12C. In this way the bandwidth on the low frequency side of the filter's passband can be changed by controlling the connection condition of the switch SW7 illustrated as FIG. 12A and the ON/OFF condition of the switches SW8 and SW9 illustrated as FIG. 12B.

Note that although the switches SW7 to SW9 are semiconductor switches in the present working example, the same effects as in the present working example can be obtained even if the switches SW7 to SW9 are Micro Electro Mechanical System (MEMS) switches.

Also, although filters is described in the present working example, the present working example can also be applied to a duplexer.

Also, although the resonators S1 to S4 and P1a to P3 are realized by SAW resonators in the present working example, the same effects as in the present working example can be obtained even if such switches are realized by FBARs.

Also, although the switches SW8 and SW9 are switch-controlled in the present working example so that when one of them is ON the other is OFF, the same effects as in the present working example can be obtained even in a case of including an operating mode in which both switches are ON simultaneously.

The resonators P1a and P1b of the present working example are examples of the compensating resonator of the present invention. The switches SW7 to SW9 of the present working example are examples of the switching unit of the present invention.

Working Example 4

Figure 13:
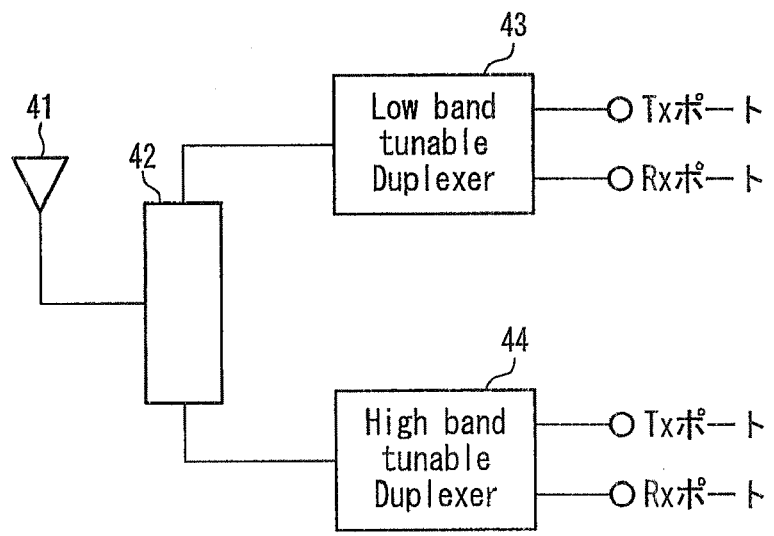
FIG. 13 is a block diagram of a duplexer using a variable band filter.

FIG. 13 is a block diagram of a communication module that includes resonators having two frequency domains, which were described in working examples 2 and 3. A low band duplexer 43 includes the resonators described in working example 3. A high band duplexer 44 includes the resonators described in working example 2. The low band duplexer 43 is a filter that passes low-band (in the vicinity of 0.7 to 1 GHz) signals. The high band duplexer 44 is a filter that passes high-band (in the vicinity of 1.7 to 2.1 GHz) signals. A switch 42 selectively connects the low band duplexer 43 or the high band duplexer 44 to an antenna 41.

The present working example enables realizing a communication module or multiband communication apparatus that is compatible with multiple bands.

3. Duplexer Structure

Duplexers are included in mobile communications (high frequency wireless communication) such as mobile phone terminals, PHS (Personal Handy-phone System) terminals, and wireless LAN systems. Duplexers have functions for transmitting and receiving communication radio waves etc. Duplexers are used in wireless apparatuses in which the transmission signal frequency and reception signal frequency are different.

Figure 14:
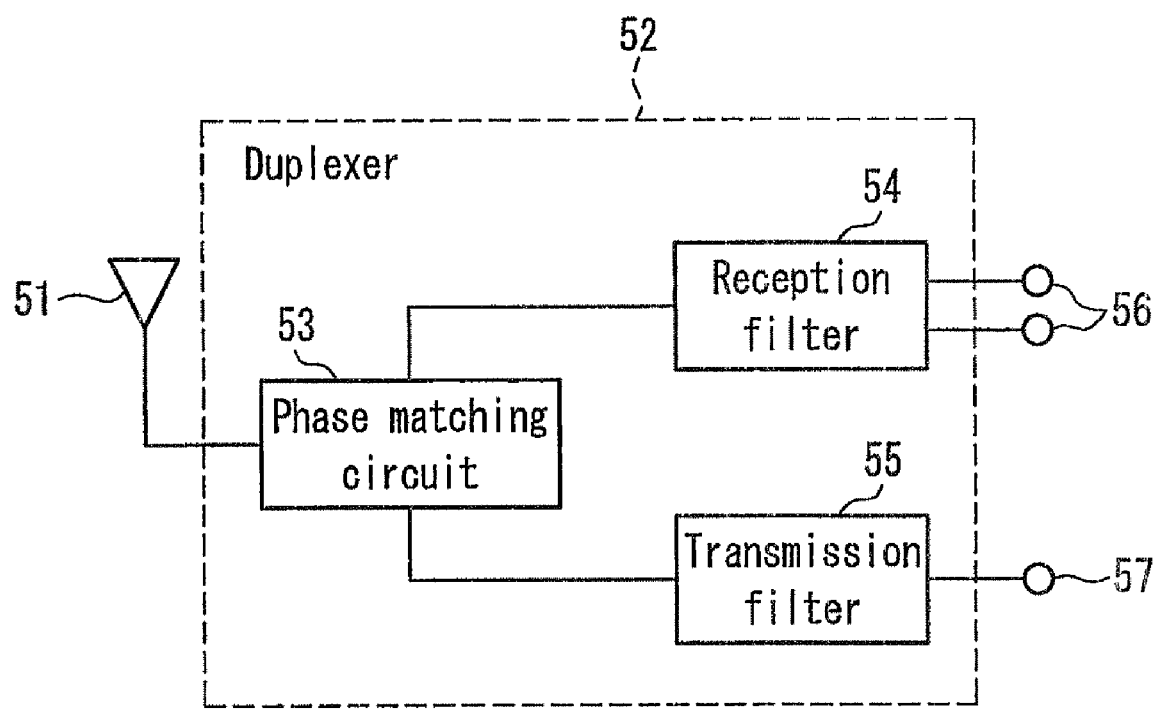
FIG. 14 is a block diagram of a duplexer according to the embodiment.

FIG. 14 is a block diagram of a duplexer including an acoustic wave device of the present embodiment. A duplexer 52 includes a phase matching circuit 53, a reception filter 54, and a transmission filter 55. The phase matching circuit 53 is an element that adjusts the phase of the impedance of the reception filter 54 in order to prevent a transmission signal output from the transmission filter 55 from flowing to the reception filter 54 side. The phase matching circuit 53 is connected to an antenna 51. The reception filter 54 is a band-pass filter that passes only a predetermined frequency band of reception signals received via the antenna 51. The reception filter 54 is connected to an output port 56. The transmission filter 55 is a band-pass filter that passes only a predetermined frequency band of transmission signals received via an input port 57. The transmission filter 55 is connected to the input port 57. Here, the reception filter 54 and the transmission filter 55 include an acoustic wave device of the present embodiment.

Including an acoustic wave device of the present embodiment in the reception filter 54 and transmission filter 55 enables realizing a duplexer that can have a favorable skirt characteristic and improved communication performance.

4. Communication Module Structure

Figure 15:
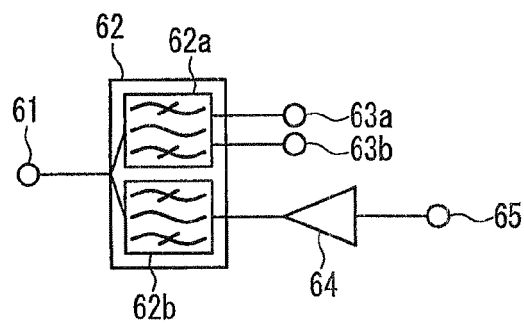
FIG. 15 is a block diagram of a communication module according to the embodiment.

FIG. 15 is an example of a communication module that includes a duplexer or acoustic wave device of the present embodiment. Illustrated as FIG. 15, a duplexer 62 includes a reception filter 62a and a transmission filter 62b. The reception filter 62a is connected to reception ports 63a and 63b that are compatible with, for example, output balancing. The transmission filter 62b is connected to a transmission port 65 via a power amp 64. Here, the reception filter 62a and the transmission filter 62b include an acoustic wave device of the present embodiment.

At a time of a reception operation, the reception filter 62a passes only a predetermined frequency band of reception signals received via an antenna port 61, and outputs the passed signals to the outside via the reception ports 63a and 63b. Also, at a time of a transmission operation, the transmission filter 62b passes only a predetermined frequency band of transmission signals that have been received from the transmission port 65 and amplified by the power amp 64, and outputs the passed signals to the outside via the antenna port 61.

Including a duplexer or acoustic wave device of the present embodiment in the reception filter 62a and transmission filter 62b of the communication module enables improving communication performance. This particularly enables an improvement in reception sensitivity. This enables realizing a communication module that is small and has a simple structure.

Note that the communication module illustrated as FIG. 15 is an example, and the same effects can be obtained by including a filter of the present invention in another embodiment of a communication module.

5. Communication Apparatus Structure

Figure 16:
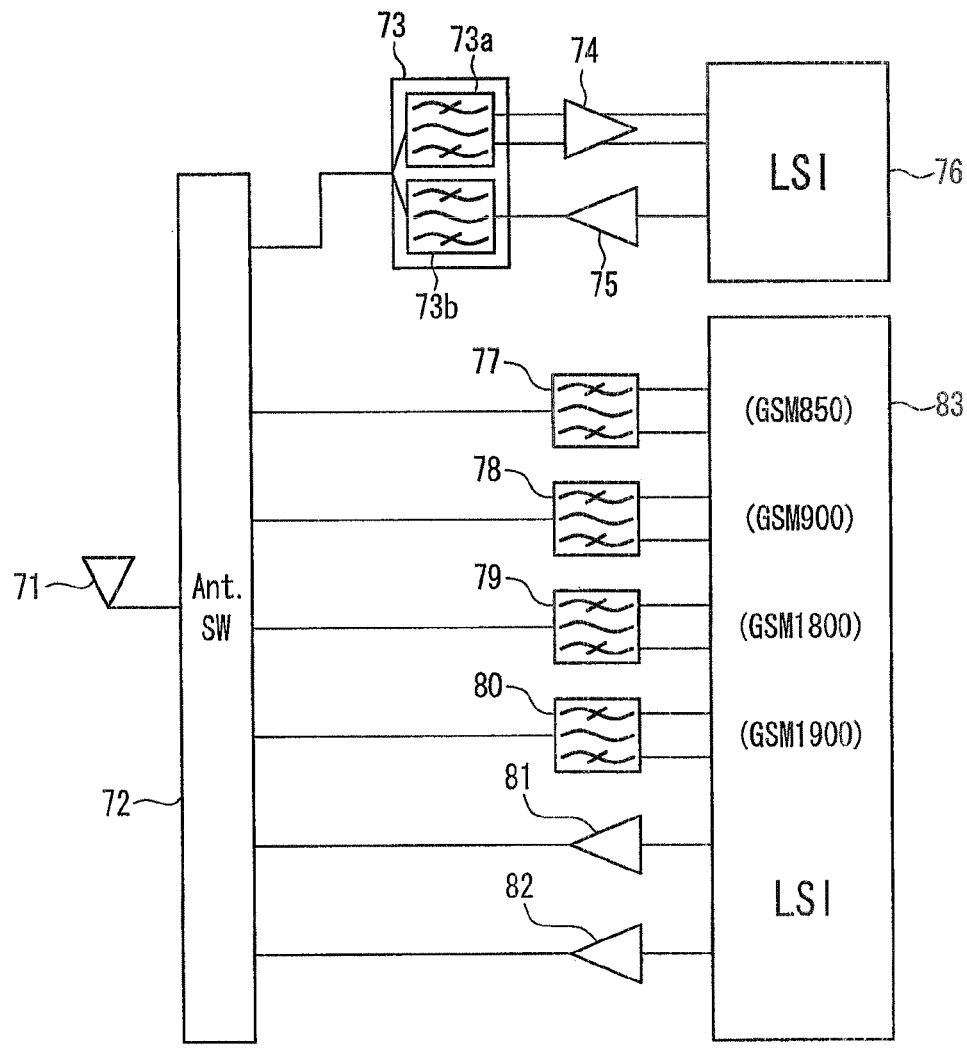
FIG. 16 is a block diagram of a communication apparatus according to the embodiment.

FIG. 16 is an RF block of a mobile phone terminal as an example of a communication apparatus including an acoustic wave device of the present embodiment. The communication apparatus illustrated as FIG. 16 is a mobile phone terminal that is compatible with a GSM (Global System for Mobile Communications) communication system and a W-CDMA (Wideband Code Division Multiple Access) communication system. The GSM communication system in the present embodiment is compatible with the 850 MHz band, the 950 MHz band, the 1.8 GHz band, and the 1.9 GHz band. Although mobile phone terminals include a microphone, speaker, liquid crystal display etc. in addition to the communication means illustrated as FIG. 16, they are not illustrated as FIG. 16 since they are not necessary to the description of the present embodiment. Here, reception filters 73a, 77, 78, 79, and 80 and a transmission filter 73b include a filter of the present embodiment.

Firstly an antenna switch circuit 72 receives a reception signal via an antenna 71 and selects an LSI that is to operate, based on whether the communication system of the reception signal is W-CDMA or GSM. If the received reception signal conforms to the W-CDMA communication system, the antenna switch circuit 72 performs switching so that the reception signal is output to the duplexer 73. The reception signal input to the duplexer 73 is limited to a predetermined frequency band by the reception filter 73a, and the resulting balanced reception signal is output to an LNA 74. The LNA 74 amplifies the received reception signal, and outputs the amplified reception signal to an LSI 76. The LSI 76 performs demodulation processing for obtaining an audio signal based on the received reception signal, and controls operations of units in the mobile phone terminal.

On the other hand, in a case of transmitting a signal, the LSI 76 generates a transmission signal. A power amp 75 amplifies the transmission signal, and transmission signal outputs to a transmission filter 73b. The transmission filter 73b passes only a predetermined frequency band of the received transmission signal. The transmission filter 73b outputs the resulting transmission signal to the antenna switch circuit 72, which outputs the transmission signal to the outside via the antenna 71.

If a received reception signal conforms to the GSM communication system, the antenna switch circuit 72 selects one of the reception filters 77 to 80 in accordance with the frequency band of the reception signal, and outputs the reception signal to the selected reception filter. The reception signal is band-limited by the selected one of the reception filters 77 to 80 and then input to an LSI 83. The LSI 83 performs demodulation processing to obtain an audio signal based on the received reception signal, and controls operations of units in the mobile phone terminal. On the other hand, in a case of transmitting a signal, the LSI 83 generates a transmission signal. The generated transmission signal is amplified by a power amp 81 or 82 and then output to the antenna switch circuit 72, which outputs the transmission signal to the outside via the antenna 71.

Including a communication module or acoustic wave device of the present embodiment in the communication apparatus enables improving communication performance. This particularly enables an improvement in reception sensitivity. This enables realizing a communication module that is small and has a simple structure.

6. Effects of the Embodiment and Supplementary Remarks

The present embodiment enables realizing an acoustic wave device that can improve a skirt characteristic. Including an acoustic wave device of the present embodiment in a duplexer, communication module, or communication apparatus enables improving the communication performance of the duplexer, communication module, or communication apparatus. This particularly enables an improvement in reception sensitivity.

In an acoustic wave device of the present invention, not only a capacitor is connected as in conventional technology, but also a resonator is additionally connected, thereby enabling reducing the size of the acoustic wave device or filter element. Reducing the size of the acoustic wave device or filter element enables reducing the size of a communication module or communication apparatus that includes the acoustic wave device or filter element.

When manufacturing an acoustic wave device or filter element, a conventional structure requires a step of implementing a capacitor separately from a resonator. However, the resonator that is additionally connected in the present embodiment can be implemented at the same time as other resonators, thereby eliminating the need to increase the number of manufacturing steps and reducing manufacturing cost. In other words, a step for implementing a capacitor is not required in the present embodiment, thereby reducing manufacturing cost.

Including the switches SW1 to SW9 and switching among a plurality of resonators that have different pass-bands enables compatibility with a plurality of frequency bands, thus making it possible to realize a communication device compatible with multiple bands. The present embodiment enables a reduction in cost since there is no need to manufacture a filter for each passband.

An acoustic wave device of the present invention is useful to a device that can transmit and receive signals of a predetermined frequency as well as is effective as a device that is compatible with a plurality of frequency bands.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it can be understood that the various changes, substitutions, and alterations could be made hereto without departing from the spirit and scope of the invention.

What is claimed is:

1. An acoustic wave device, comprising
a ladder-type filter in which a plurality of resonators are series-connected in a parallel line, and include a compensating resonator having a resonance frequency that is higher than a resonance frequency of another resonator connected in the parallel line and a resonance frequency of a resonator connected in another parallel line, the resonators connected in the parallel line have mutually different resonance frequencies, wherein the compensating resonator has a capacitance that is greater than a capacitance of another resonator.

2. The acoustic wave device according to claim 1, wherein the resonators and the compensating resonator are each a film bulk acoustic resonator.

3. The acoustic wave device according to claim 1, wherein the resonators and the compensating resonator are each a surface acoustic wave resonator.

4. A duplexer comprising an acoustic wave device according to claim 1.

5. A communication module comprising a duplexer according to claim 2.

6. The communication module of claim 5, further comprising a low frequency side duplexer and a high frequency side duplexer that have different pass-bands.

7. A communication apparatus comprising a communication module according to claim 5.

8. An acoustic wave device, comprising:
a ladder-type filter in which a plurality of resonators are series-connected in a parallel line, and include a compensating resonator having a resonance frequency that is higher than a resonance frequency of another resonator connected in the parallel line and a resonance frequency of a resonator connected in another parallel line, the resonators connected in the parallel line have mutually different resonance frequencies; and a switching unit able to switch operating of the compensating resonator between ON and OFF.

9. An acoustic wave device, comprising:
a ladder-type filter in which a plurality of resonators are series-connected in a parallel line, and include a compensating resonator having a resonance frequency that is higher than a resonance frequency of another resonator connected in the parallel line and a resonance frequency of a resonator connected in another parallel line, the resonators connected in the parallel line have mutually different resonance frequencies, wherein the compensating resonator includes a plurality of resonators that have mutually different resonance frequencies; and
a switching unit that selectively causes one of the plurality of resonators to be in a conduction condition.

10. The acoustic wave device according to claim 9, wherein the switching unit is a Micro Electro Mechanical System (MEMS) switch.

11. An acoustic wave device, comprising:
a ladder-type filter in which a plurality of resonators are series-connected in a parallel line, and include a compensating resonator having a resonance frequency that is higher than a resonance frequency of another resonator connected in the parallel line and a resonance frequency of a resonator connected in another parallel line, the resonators connected in the parallel line have mutually different resonance frequencies; and
a switching unit able to switch a passband of the compensating resonator.

* * * * *